(12) United States Patent
Tanaka et al.

(10) Patent No.: US 10,651,056 B2
(45) Date of Patent: May 12, 2020

(54) TREATING LIQUID VAPORIZING APPARATUS

(71) Applicant: SCREEN Holdings Co., Ltd., Kyoto (JP)

(72) Inventors: Atsushi Tanaka, Kyoto (JP); Yukihiko Inagaki, Kyoto (JP); Koji Nishi, Kyoto (JP); Shigehiro Goto, Kyoto (JP); Toru Momma, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 468 days.

(21) Appl. No.: 15/421,814

(22) Filed: Feb. 1, 2017

(65) Prior Publication Data

US 2017/0221731 A1   Aug. 3, 2017

(30) Foreign Application Priority Data

Feb. 3, 2016   (JP) ................................. 2016-018916

(51) Int. Cl.
*H01L 21/67* (2006.01)
*C03C 17/30* (2006.01)
*B05D 1/00* (2006.01)

(52) U.S. Cl.
CPC ........ *H01L 21/67023* (2013.01); *C03C 17/30* (2013.01); *H01L 21/67017* (2013.01); *B05D 1/60* (2013.01); *C03C 2217/76* (2013.01); *C03C 2218/112* (2013.01); *C03C 2218/15* (2013.01)

(58) Field of Classification Search
CPC . C03C 17/30; C03C 2217/76; C03C 2218/15; H01L 21/67017; H01L 21/67023; C23C 16/4481; C23C 16/4482

See application file for complete search history.

(56) References Cited

U.S. PATENT DOCUMENTS

| 5,520,858 A | | 5/1996 | Yamaguchi et al. ........... 261/130 |
| 6,039,809 A | * | 3/2000 | Toyama .................. B01F 3/026 118/715 |
| 6,132,515 A | * | 10/2000 | Gauthier ............. C23C 16/4481 118/715 |

(Continued)

FOREIGN PATENT DOCUMENTS

| JP | 63-018076 A | 1/1988 |
| JP | S63-019570 U | 2/1988 |

(Continued)

OTHER PUBLICATIONS

Office Action dated Oct. 27, 2018 for corresponding Korean Patent Application No. 10-2017-0015389.

(Continued)

*Primary Examiner* — Bret P Chen
(74) *Attorney, Agent, or Firm* — Ostrolenk Faber LLP

(57) ABSTRACT

A treating liquid vaporizing apparatus includes a buffer tank for storing a treating liquid, a vaporizing container connected to the buffer tank for vaporizing the treating liquid, a further vaporizing container connected to the buffer tank in parallel with the vaporizing container for vaporizing the treating liquid, a switch valve for opening and closing a flow path of the treating liquid between the buffer tank and the vaporizing container, and a switch valve for opening and closing a flow path of the treating liquid between the buffer tank and the further vaporizing container.

19 Claims, 11 Drawing Sheets

(56) References Cited

U.S. PATENT DOCUMENTS

| | | | | |
|---|---|---|---|---|
| 6,224,681 | B1* | 5/2001 | Sivaramakrishnan | B01F 3/022 |
| | | | | 118/726 |
| 7,899,309 | B2* | 3/2011 | Whyatt | F23D 11/448 |
| | | | | 392/307 |
| 2001/0000198 | A1 | 4/2001 | Takeshita et al. | 118/715 |
| 2001/0035127 | A1* | 11/2001 | Metzner | C23C 16/407 |
| | | | | 118/715 |
| 2002/0043215 | A1* | 4/2002 | Yoshioka | B01D 1/0082 |
| | | | | 118/715 |
| 2002/0186965 | A1* | 12/2002 | Zimmer | F23K 5/22 |
| | | | | 392/397 |
| 2003/0037731 | A1 | 2/2003 | Shim | 118/726 |
| 2005/0196606 | A1* | 9/2005 | Ihara | G11B 5/746 |
| | | | | 428/323 |
| 2006/0037539 | A1* | 2/2006 | Toda | C23C 16/40 |
| | | | | 118/726 |
| 2006/0278166 | A1* | 12/2006 | Yamoto | C23C 16/4481 |
| | | | | 118/726 |
| 2008/0023444 | A1 | 1/2008 | Osawa | 216/83 |
| 2008/0050510 | A1 | 2/2008 | Stevens et al. | 427/8 |
| 2008/0168946 | A1 | 7/2008 | Nam et al. | 118/726 |
| 2008/0302302 | A1 | 12/2008 | Horita et al. | 118/715 |
| 2009/0152093 | A1* | 6/2009 | Millar | B01D 5/0006 |
| | | | | 203/10 |
| 2011/0079252 | A1 | 4/2011 | Minamida et al. | 134/94.1 |
| 2012/0034369 | A1* | 2/2012 | Ito | C23C 16/52 |
| | | | | 427/8 |
| 2012/0160172 | A1* | 6/2012 | Wamura | C23C 16/4402 |
| | | | | 118/726 |
| 2015/0246329 | A1 | 9/2015 | Itonaga et al. | 261/131 |
| 2015/0262737 | A1 | 9/2015 | Hinode et al. | 156/345.18 |

FOREIGN PATENT DOCUMENTS

| | | | | |
|---|---|---|---|---|
| JP | H03-096357 | | 10/1991 | |
| JP | H11-260809 | A | 9/1999 | |
| JP | 2000-252269 | A | 9/2000 | |
| JP | 2002-118102 | A | 4/2002 | |
| JP | 2004-031782 | A | 1/2004 | |
| JP | 2010-501729 | A | 1/2010 | |
| JP | 2011-082279 | A | 4/2011 | |
| KR | 10-2002-0024798 | A | 4/2002 | |
| KR | 10-2003-0018107 | | 3/2003 | |
| KR | 10-2007-0082350 | A | 8/2007 | |
| KR | 10-2008-0010306 | | 1/2008 | |
| KR | 10-2008-0066411 | | 7/2008 | |
| TW | 201604959 | A | 2/2016 | |
| WO | WO 2007/086393 | A1 | 8/2007 | |
| WO | WO 2016/118941 | A1 * | 7/2016 | A61M 15/00 |
| WO | WO 2017/218506 | A1 * | 12/2017 | A24F 47/00 |

OTHER PUBLICATIONS

Office Action and Search Report for corresponding Taiwan Patent Application No. 106101683 dated Jan. 18, 2018.
Notice of Allowance dated Jul. 2, 2019 in corresponding Korean Patent Application No. 10-2017-0015389.
Office Action dated Jul. 23, 2019 in corresponding Japanese Patent Application No. 2016-018916.
Office Action dated Jan. 21, 2020 for Japanese Patent Application No. 2016-018916.

* cited by examiner

TREATING LIQUID VAPORIZING APPARATUS

CROSS-REFERENCE TO RELATED APPLICATIONS

This application claims priority to Japanese Patent Application No. 2016-18916 filed Feb. 3, 2016, the disclosure of which is hereby incorporated herein by reference in its entirety for all purposes.

BACKGROUND OF THE INVENTION

(1) Field of the Invention

This invention relates to a treating liquid vaporizing apparatus for vaporizing a treating liquid and to a substrate treating apparatus for treating substrates. The substrates are semiconductor wafers, glass substrates for photomasks, glass substrates for liquid crystal displays, substrates for optical disks and so on.

(2) Description of the Related Art

Conventionally, this type of substrate treating apparatus includes a fluid supply system and a plurality of treating units. The fluid supply system supplies a treating fluid to the plurality of treating units. The treating fluid is isopropyl alcohol, deionized water, an SC1 solution (a mixture of ammonia and hydrogen peroxide solution), or a dilute hydrofluoric acid aqueous solution, for example. Or the treating fluid is a vapor such as of hexamethyldisilazane (HMDS), for example. Each treating unit treats substrates using the fluid.

The fluid supply system includes one tank, one supply line and a plurality of branch lines. The tank stores the treating fluid. The supply line is connected to the tank. One end of each branch line is connected to the supply line. The other end of each branch line is individually connected to the treating unit (as disclosed in Japanese Unexamined Patent Publication No. 2011-082279, for example).

SUMMARY OF THE INVENTION

However, the conventional substrate treating apparatus has the following problem.

The number of treating units operating at the same time is variable. For example, a plurality of treating units may perform treatment at the same time, or only one treating unit may perform treatment while the other treating units are at rest. Thus, a feed rate of the treating fluid at which the fluid supply system supplies to the treating units is variable with an operating situation of the treating units.

Particularly when the treating fluid is a treating gas and the feed rate of the treating gas varies, the concentration of the treating gas tends to vary. Variations in the concentration of the treating gas make it difficult to maintain the quality of treatment by the treating units.

This invention has been made having regard to the state of the art noted above, and its object is to provide a treating liquid vaporizing apparatus and a substrate treating apparatus capable of inhibiting variations in concentration of a treating gas.

To fulfill the above object, this invention provides the following construction.

A treating liquid vaporizing apparatus, according to this invention, comprises a tank for storing a treating liquid; a first vaporizing container connected to the tank for vaporizing the treating liquid; a second vaporizing container connected to the tank in parallel with the first vaporizing container for vaporizing the treating liquid; a first treating liquid valve for opening and closing a flow path of the treating liquid between the tank and the first vaporizing container; and a second treating liquid valve for opening and closing a flow path of the treating liquid between the tank and the second vaporizing container.

When the first treating liquid valve is closed, the first vaporizing container is separated (cut off) from the tank and the second vaporizing container. When the first vaporizing container is separated from the tank and the second vaporizing container, the first vaporizing container can vaporize the treating liquid without being influenced by the tank and the second vaporizing container. The first vaporizing container can therefore produce a treating gas conveniently. That is, it can conveniently inhibit variations in the concentration of the treating gas inside the first vaporizing container.

When the second treating liquid valve is closed, the second vaporizing container is separated from the tank and the first vaporizing container. When the second vaporizing container is separated from the tank and the first vaporizing container, the second vaporizing container can vaporize the treating liquid without being influenced by the tank and the first vaporizing container. The second vaporizing container can therefore produce a treating gas conveniently. That is, it can conveniently inhibit variations in the concentration of the treating gas inside the second vaporizing container.

The first treating liquid valve and second treating liquid valve can be opened and closed individually.

For example, only one of the first treating liquid valve and second treating liquid valve may be closed. In this case, one of the first vaporizing container and second vaporizing container is separated from the other of the first vaporizing container and second vaporizing container and the tank. Therefore, one of the first vaporizing container and second vaporizing container can conveniently produce the treating gas. That is, the treating liquid vaporizing apparatus can conveniently produce a relatively small quantity of treating gas.

For example, both of the first treating liquid valve and second treating liquid valve may be closed. In this case, the first vaporizing container, second vaporizing container and tank are separated from one another. Therefore, both of the first vaporizing container and second vaporizing container can conveniently produce the treating gas. That is, the treating liquid vaporizing apparatus can conveniently produce a relatively large quantity of treating gas.

Thus, in either case, the treating liquid vaporizing apparatus can conveniently inhibit variations in the concentration of the treating gas.

In the above treating liquid vaporizing apparatus, it is preferred that the treating gas produced in the first vaporizing container is sent only to the first treating unit, and the treating gas produced in the second vaporizing container is sent only to the second treating unit. In other words, it is preferred that the first vaporizing container produces only the treating gas for supplying one first treating unit and that the second vaporizing container produces only the treating gas for supplying one second treating unit. This can conveniently inhibit variations in the quantity of treating gas produced in the first vaporizing container. Variations in the concentration of the treating gas in the first vaporizing container can therefore be inhibited with increased effect. Similarly, this can conveniently inhibit variations in the quantity of treating gas produced in the second vaporizing container. Variations in the concentration of the treating gas in the second vaporizing container can therefore be inhibited with increased effect.

In the above treating liquid vaporizing apparatus, it is preferred that the tank has an interior thereof opened to an exterior of the tank; the treating liquid vaporizing apparatus comprising a first vent valve for opening and closing an interior of the first vaporizing container to an exterior of the first vaporizing container; and a second vent valve for opening and closing an interior of the second vaporizing container to an exterior of the second vaporizing container. When the first vent valve is opened, the pressure inside the first vaporizing container becomes substantially equal to the pressure inside the tank. The treating liquid can therefore be supplied easily from the tank to the first vaporizing container. Similarly, when the second vent valve is opened, the pressure inside the second vaporizing container becomes substantially equal to the pressure inside the tank. The treating liquid can therefore be supplied easily from the tank to the second vaporizing container.

In the above treating liquid vaporizing apparatus, it is preferred that the first vaporizing container and the second vaporizing container are arranged laterally of the tank, respectively. The treating liquid can be supplied from the tank to the first vaporizing container with increased ease. Similarly, the treating liquid can be supplied from the tank to the second vaporizing container with increased ease.

In the above treating liquid vaporizing apparatus, it is preferred that, when the first, treating liquid valve and the first vent valve are opened, the treating liquid naturally moves between the tank and the first vaporizing container, thereby equalizing a liquid level of the treating liquid in the tank and a liquid level of the treating liquid in the first vaporizing container; and when the second treating liquid valve and the second vent valve are opened, the treating liquid naturally moves between the tank and the second vaporizing container, thereby equalizing a liquid level of the treating liquid in the tank and a liquid level of the treating liquid in the second vaporizing container. With the simple construction, the treating liquid can be supplied in an appropriate quantity to the first vaporizing container. Similarly, with the simple construction, the treating liquid can easily be supplied in an appropriate quantity to the second vaporizing container.

In the above treating liquid vaporizing apparatus, it is preferred that the first vent valve opens when the first treating liquid valve is open; and the second vent valve opens when the second treating liquid valve is open. Since the first vent valve opens when the first treating liquid valve is open, the treating liquid can easily be supplied to the first vaporizing container. Similarly, since the second vent valve opens when the second treating liquid valve is open, the treating liquid can easily be supplied to the second vaporizing container.

It is preferred that the above treating liquid vaporizing apparatus comprises a pressure regulator for regulating pressure inside the tank. Regulating the pressure in the tank can conveniently regulate a pressure difference between the tank and the first vaporizing container. By using this pressure difference, the treating liquid can be supplied conveniently from the tank to the first vaporizing container. Similarly, regulating the pressure in the tank can conveniently regulate a pressure difference between the tank and the second vaporizing container. By using this pressure difference, the treating liquid can be supplied conveniently from the tank to the second vaporizing container.

In the above treating liquid vaporizing apparatus, it is preferred that the first vaporizing container is disposed in a position higher than the tank; and the second vaporizing container is disposed in a position higher than the tank. By using the pressure difference, the treating liquid can be supplied from the tank to the first vaporizing container disposed above the tank. Thus, even if the first vaporizing container is disposed in a position higher than the tank, the treating liquid can be supplied to the first vaporizing container with no problem. Similarly, even if the second vaporizing container is disposed in a position higher than the tank, the treating liquid can be supplied to the second vaporizing container with no problem.

In the above treating liquid vaporizing apparatus, it is preferred that, when the first treating liquid valve is open and the pressure regulator regulates the pressure inside the tank, the treating liquid is forcibly moved between the tank and the first vaporizing container; and when the second treating liquid valve is open and the pressure regulator regulates the pressure inside the tank, the treating liquid is forcibly moved between the tank and the second vaporizing container. The treating liquid can be supplied conveniently to the first vaporizing container. Similarly, the treating liquid can be supplied conveniently to the second vaporizing container.

In the above treating liquid vaporizing apparatus, it is preferred that the tank has an upper end thereof lower than both an upper end of the first vaporizing container and an upper end of the second vaporizing container. Even if the treating liquid overflows the tank, the treating liquid can be conveniently prevented from overflowing the first vaporizing container. Similarly, even if the treating liquid overflows the tank, the treating liquid can be conveniently prevented from overflowing the second vaporizing container.

It is preferred that the above treating liquid vaporizing apparatus comprises a first inert gas valve for opening and closing a flow path of an inert gas sent to the first vaporizing container; and a second inert gas valve for opening and closing a flow path of the inert gas sent to the second vaporizing container. The inert gas can be supplied individually to the first vaporizing container and the second vaporizing container. When, for example, both the first inert gas valve and second inert gas valve are open, the inert gas can be supplied to both the first vaporizing container and the second vaporizing container at the same time. Consequently, both the first vaporizing container and the second vaporizing container can vaporize the treating liquid in parallel. When, for example, only one of the first inert gas valve and second inert gas valve is open, the inert gas can be supplied to only one of the first vaporizing container and second vaporizing container. Consequently, only one of the first vaporizing container and second vaporizing container can vaporize the treating liquid.

In the above treating liquid vaporizing apparatus, it is preferred that, when the first treating liquid valve is open, the first inert gas valve is closed; and when the second treating liquid valve is open, the second inert gas valve is closed. Since the first inert gas valve is closed when the first treating liquid valve is open, variations in the concentration can be prevented from occurring to the treating gas in the first vaporizing container. Similarly, since the second inert gas valve is closed when the second treating liquid valve is open, variations in the concentration can be prevented from occurring to the treating gas in the second vaporizing container.

It is preferred that the above treating liquid vaporizing apparatus comprises a first treating gas valve for opening and closing a flow path of a treating gas outputted from the first vaporizing container; and a second treating gas valve for opening and closing a flow path of a treating gas outputted from the second vaporizing container. The first vaporizing container and the second vaporizing container can individually output the treating gas. When, for example, both the first treating gas valve and the second treating gas valve are open, the treating gas can be outputted from both the first vaporizing container and second vaporizing container at the same time. When, for example, only one of the first treating gas valve and the second treating gas valve is open, the treating gas can be outputted from only one of the first vaporizing container and second vaporizing container.

In the above treating liquid vaporizing apparatus, it is preferred that, when the first treating liquid valve is open, the first treating gas valve is closed; and when the second treating liquid valve is open, the second treating gas valve is closed. Since the first treating gas valve is closed when the first treating liquid valve is open, that is when the first vaporizing container is in communication with the tank, the treating gas in the first vaporizing container does not flow out of the first vaporizing container through the flow path of the treating gas. This can prevent the treating gas in varying concentrations from flowing out of the first vaporizing container. Similarly, since the second treating gas valve is closed when the second treating liquid valve is open, the treating gas in varying concentrations is prevented from flowing out of the second vaporizing container.

It is preferred that the above treating liquid vaporizing apparatus comprises a tank treating liquid valve for opening and closing a flow path of the treating liquid supplied from a treating liquid supply source to the tank. This construction conveniently enables switching between supply and stopping of the treating liquid from the treating liquid supply source to the tank.

It is preferred that the above treating liquid vaporizing apparatus comprises a liquid level detecting sensor for detecting a liquid level of the treating liquid in the tank; wherein the tank treating liquid valve is opened and closed based on detection results of the liquid level detecting sensor. The treating liquid can be supplied from the treating liquid supply source to the tank at appropriate times.

It is preferred that the above treating liquid vaporizing apparatus comprises an overflow sensor for detecting whether the treating liquid is overflowing an upper end of the tank; wherein the first treating liquid valve and the second treating liquid valve are closed when it is determined based on detection results of the overflow sensor that the treating liquid is overflowing the tank. The treating liquid can be prevented from overflowing the first vaporizing container and from overflowing the second vaporizing container It is preferred that the above treating liquid vaporizing apparatus comprises a first attenuation valve for opening and closing a flow path of an inert gas for attenuating a treating gas outputted from the first vaporizing container; and a second attenuation valve for opening and closing a flow path of the inert gas for attenuating a treating gas outputted from the second vaporizing container. When the first attenuation valve is opened, the inert gas can be mixed with the treating gas outputted from the first vaporizing container. Consequently, the treating gas outputted from the first vaporizing container can be attenuated conveniently. Similarly, since the treating liquid vaporizing apparatus has a second attenuation valve, the treating gas outputted from the second vaporizing container can be attenuated conveniently.

In the above treating liquid vaporizing apparatus, it is preferred that the first vaporizing container and the second vaporizing container are arranged in the same height position. The treating liquid can be supplied in substantially the same quantity to the first vaporizing container and the second vaporizing container.

According to another aspect of this invention, a substrate treating apparatus is provided which comprises a first vaporizing container connected to the tank for vaporizing the treating liquid; a second vaporizing container connected to the tank in parallel with the first vaporizing container for vaporizing the treating liquid; a first treating liquid valve for opening and closing a flow path of the treating liquid between the tank and the first vaporizing container; a second treating liquid valve for opening and closing a flow path of the treating liquid between the tank and the second vaporizing container; a first treating unit for treating substrates using a treating gas produced in the first vaporizing container; and a second treating unit for treating substrates using a treating gas produced in the second vaporizing container.

When the first treating liquid valve is closed, the first vaporizing container is separated (cut off) from the tank and the second vaporizing container. The first vaporizing container can vaporize the treating liquid without being influenced by the tank and the second vaporizing container. This can conveniently inhibit variations in the concentration of the treating gas inside the first vaporizing container.

When the second treating liquid valve is closed, the second vaporizing container is separated from the tank and the first vaporizing container. The second vaporizing container can vaporize the treating liquid without being influenced by the tank and the first vaporizing container. This can conveniently inhibit variations in the concentration of the treating gas inside the second vaporizing container.

The first treating liquid valve and second treating liquid valve can be opened and closed individually. For example, only one of the first treating liquid valve and second treating liquid valve may be closed. In this case, the treating gas can be conveniently produced in only one of the first vaporizing container and second vaporizing container. For example, both of the first treating liquid valve and second treating liquid valve may be closed. In this case, both of the first vaporizing container and second vaporizing container can conveniently produce the treating gas. Thus, in either case, the substrate treating apparatus can conveniently inhibit variations in the concentration of the treating gas.

Further, the first vaporizing container produces only the treating gas for supplying the single first treating unit. This can conveniently inhibit variations in the quantity of treating gas produced in the first vaporizing container. Variations in concentration can be prevented with increased effect from occurring to the treating gas in the first vaporizing container. Similarly, the second vaporizing container produces only the treating gas for supplying the single second treating unit. This can conveniently inhibit variations in the quantity of treating gas produced in the second vaporizing container. Variations in concentration can be prevented with increased effect from occurring to the treating gas in the second vaporizing container.

The first treating unit treats substrates using the treating gas produced by the first vaporizing container. This can keep the quality of treatment in the first treating unit excellent. Similarly, the second treating unit treats substrates using the treating gas produced by the second vaporizing container. This can keep the quality of treatment in the second treating unit excellent.

This specification also discloses an invention relating to the following treating liquid vaporizing apparatus.

(1) The treating liquid vaporizing apparatus set out hereinbefore comprises a first supply pipe for connecting the tank and the first vaporizing container, and a second supply pipe for connecting the tank and the second vaporizing container, wherein the first treating liquid valve is mounted on the first supply pipe, and the second treating liquid valve is mounted on the second supply pipe.

According to the treating liquid vaporizing apparatus set out in (1) above, the first vaporizing container and the second vaporizing container can be connected to the tank in parallel with each other.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Embodiment 1

Embodiment 1 of this invention will be described hereinafter with reference to the drawings.

Figure 1:
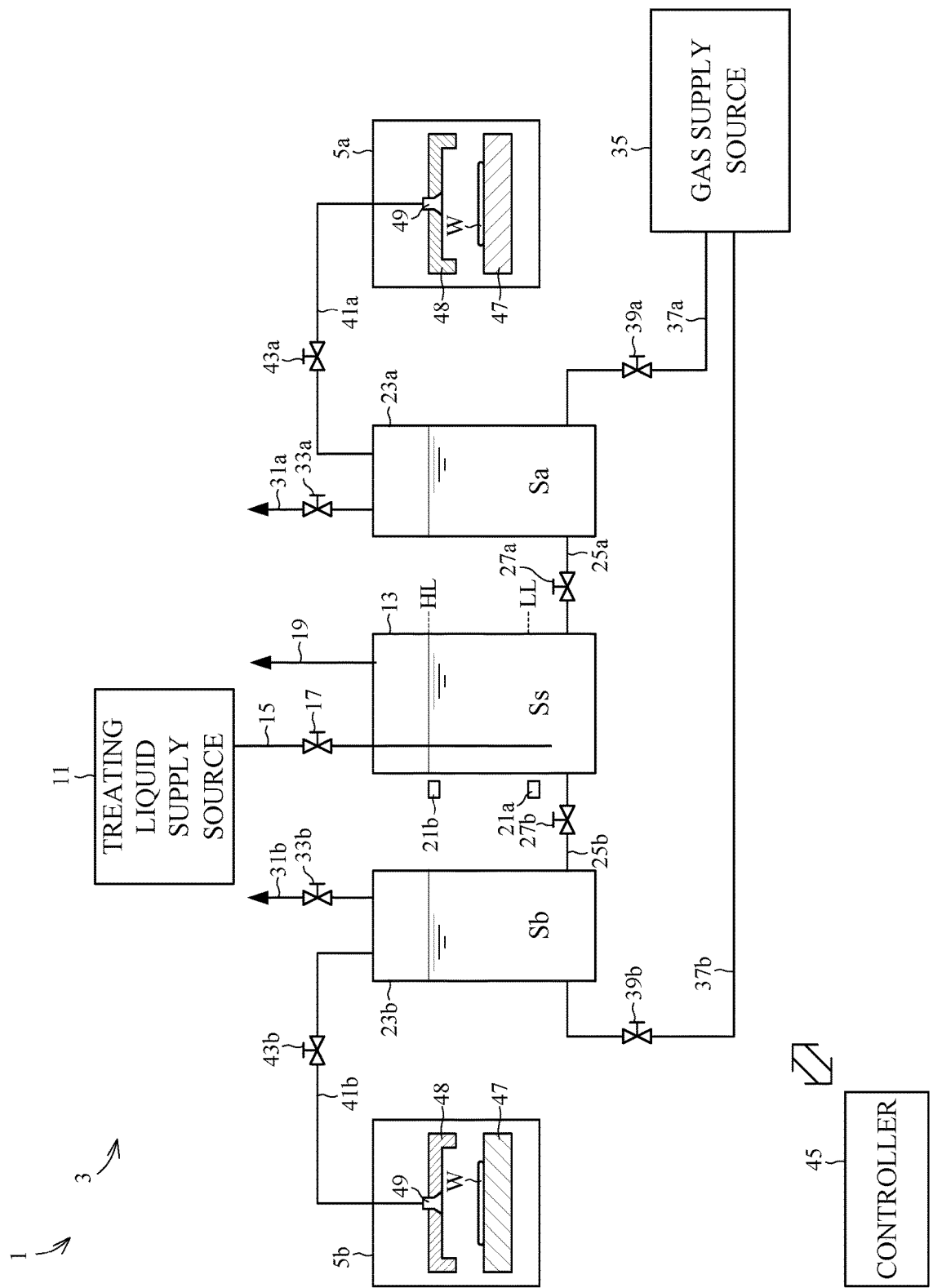
FIG. 1 is a view showing a construction of a substrate treating apparatus according to Embodiment 1.

FIG. 1 is a view showing a construction of a substrate treating apparatus according to Embodiment 1.

The substrate treating apparatus according to Embodiment 1 is an apparatus for treating substrates (e.g. semiconductor wafers) W.

The substrate treating apparatus 1 includes a treating liquid vaporizing apparatus 3 and a plurality of (e.g. two) treating units 5a and 5b. The treating liquid vaporizing apparatus 3 produces a treating gas by vaporizing a treating liquid. The treating gas is a gas including the vaporized treating liquid. The treating liquid vaporizing apparatus 3 supplies the treating gas to the treating units 5a and 5b. The treating units 5a and 5b treat the wafers W using the treating gas.

The treating liquid vaporizing apparatus 3 includes a treating liquid supply source 11, a buffer tank 13, piping 15, a switch valve 17, and piping 19. The treating liquid supply source 11 supplies the treating liquid to the buffer tank 13. The treating liquid is hexamethyldisilazane (HMDS), for example. The buffer tank 13 stores the treating liquid. In FIG. 1, sign "Ss" is affixed to the treating liquid stored in the buffer tank 13. The piping 15 connects the treating liquid supply source 11 and buffer tank 13. The switch valve 17 is mounted on the piping 15. The switch valve 17 is operable to open and close a flow path of the treating liquid between the treating liquid supply source 11 and buffer tank 13. The piping 19 opens the interior of the buffer tank 13 to the exterior of the buffer tank 13. One end of the piping 19 is connected to an upper part of the buffer tank 13. The other end of the piping 19 is open to the exterior of the buffer tank 13. The piping 19 keeps gas pressure inside the buffer tank 13 substantially equal to atmospheric pressure outside the buffer tank 13.

The treating liquid vaporizing apparatus 3 includes level sensors 21a and 21b. The level sensors 21a and 21b are attached to the buffer tank 13. The level sensors 21a and 21b detect liquid levels of the treating liquid in the buffer tank 13. The "liquid levels of the treating liquid" refer to height positions of the surface of the treating liquid. The level sensor 21a detects whether or not the liquid level of the treating liquid in the buffer tank 13 is equal to or higher than a low level LL. The level sensor 21b detects whether or not the liquid level of the treating liquid in the buffer tank 13 is equal to or higher than a high level HL. The level sensors 21a and 21b, when not distinguished in particular, will be written "level sensors 21".

The treating liquid vaporizing apparatus 3 includes a plurality of (e.g. two) vaporizing containers 23a and 23b. The vaporizing containers 23a and 23b vaporize the treating liquids, respectively. More particularly, the vaporizing containers 23a and 23b store the treating liquids. In FIG. 1, sign "Sa" is affixed to the treating liquid stored in the vaporizing container 23a, and sign "Sb" to the treating liquid stored in the vaporizing container 23b. The vaporizing container 23a vaporizes the treating liquid Sa, and the vaporizing container 23b the treating liquid Sb. Consequently, the vaporizing containers 23a and 23b produce the treating gas, respectively. The treating gas is a gas including vaporized HMDS, for example.

The treating liquid vaporizing apparatus 3 includes piping 25a and 25b. The piping 25a connects the buffer tank 13 and vaporizing container 23a to provide communication with each other. One end of the piping 25a is connected to a lower part of the buffer tank 13. The other end of the piping 25a is connected to a lower part of the vaporizing container 23a. The piping 25b connects the buffer tank 13 and vaporizing container 23b to provide communication with each other. One end of the piping 25b is connected to a lower part of the buffer tank 13. The other end of the piping 25b is connected to a lower part of the vaporizing container 23b. The vaporizing containers 23a and 23b are connected in parallel to each other to be in communication with the buffer tank 13.

The treating liquid vaporizing apparatus 3 includes switch valves 27a and 27b. The switch valve 27a is operable to open and close a flow path of the treating liquid between the buffer tank 13 and vaporizing container 23a. The switch valve 27a is disposed between the buffer tank 13 and vaporizing container 23a. Specifically, the switch valve 27a is mounted on the piping 25a. Similarly, the switch valve 27b is operable to open and close a flow path of the treating liquid between the buffer tank 13 and vaporizing container 23b. The switch valve 27b is disposed between the buffer tank 13 and vaporizing container 23b. Specifically, the switch valve 27b is mounted on the piping 25b. The switch valves 27a and 27b are connected in parallel to each other to be in communication with the buffer tank 13.

The switch valve 27a opens and closes the flow path of the treating liquid between the buffer tank 13 and vaporizing container 23a, without opening and closing the flow path of the treating liquid between the buffer tank 13 and vaporizing container 23b. Similarly, the switch valve 27b opens and closes the flow path of the treating liquid between the buffer tank 13 and vaporizing container 23b, without opening and closing the flow path of the treating liquid between the buffer tank 13 and vaporizing container 23a.

The treating liquid vaporizing apparatus 3 includes piping 31a and 31b and switch valves 33a and 33b. One end of the piping 31a is connected to an upper part of the vaporizing container 23a. The other end of the piping 31a is open to the exterior of the vaporizing container 23a. One end of the piping 31b is connected to an upper part of the vaporizing container 23b. The other end of the piping 31b is open to the exterior of the vaporizing container 23b. The switch valve 33a is mounted on the piping 31a. The switch valve 33a is operable to open and close the interior of the vaporizing container 23a to the exterior of the vaporizing container 23a. The switch valve 33b is mounted on the piping 31b. The switch valve 33b is operable to open and close the interior of the vaporizing container 23b to the exterior of the vaporizing container 23b.

The treating liquid vaporizing apparatus 3 includes a gas supply source 35, piping 37a and 37b, and switch valves 39a and 39b. The gas supply source 35 supplies an inert gas to the vaporizing containers 23a and 23b. The inert gas is nitrogen gas, for example. The piping 37a connects the gas supply source 35 and vaporizing container 23a to provide communication with each other. The piping 37b connects the gas supply source 35 and vaporizing container 23b to provide communication with each other. The switch valve 39a is mounted on the piping 37a. The switch valve 39a is operable to open and close a flow path of the inert gas between the gas supply source 35 and vaporizing container 23a. The switch valve 39b is mounted on the piping 37b. The switch valve 39b is operable to open and close a flow path of the inert gas between the gas supply source 35 and vaporizing container 23b.

The switch valve 39a opens and closes the flow path of the inert gas between the gas supply source 35 and vaporizing container 23a, without opening and closing the flow path of the inert gas between the gas supply source 35 and vaporizing container 23b. The switch valve 39b opens and closes the flow path of the inert gas between the gas supply source 35 and vaporizing container 23b, without opening and closing the flow path of the inert gas between the gas supply source 35 and vaporizing container 23a.

The treating liquid vaporizing apparatus 3 includes piping 41a and 41b and switch valves 43a and 43b. One end of the piping 41a is connected to an upper part of the vaporizing container 23a. The other end of the piping 41a is connected to the treating unit 5a. One end of the piping 41b is connected to an upper part of the vaporizing container 23b. The other end of the piping 41b is connected to the treating unit 5b. The switch valve 43a is mounted on the piping 41a. The switch valve 43a is operable to open and close a flow path of the treating gas outputted from the vaporizing container 23a. The switch valve 43b is mounted on the piping 41b. The switch valve 43b is operable to open and close a flow path of the treating gas outputted from the vaporizing container 23b.

The switch valve 43a opens and closes the flow path of the treating gas outputted from the vaporizing container 23a, without opening and closing the flow path of the treating gas outputted from the vaporizing container 23b. The switch valve 43b opens and closes the flow path of the treating gas outputted from the vaporizing container 23b, without opening and closing the flow path of the treating gas outputted from the vaporizing container 23a.

Figure 2A:
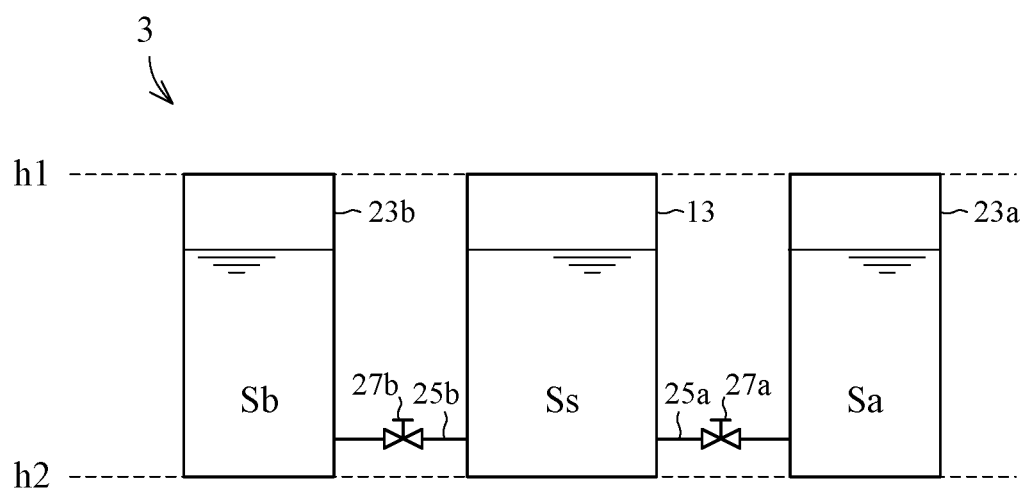
FIG. 2A is a front view of a buffer tank and vaporizing containers.
Figure 2B:
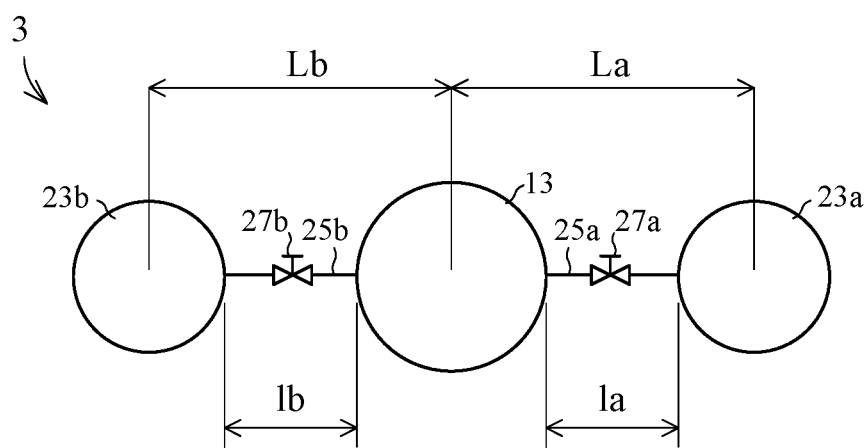
FIG. 2B is a plan view of the buffer tank and vaporizing containers.

A positional relationship between the buffer tank 13 and vaporizing containers 23a and 23b will be described. FIG. 2A is a front view of the buffer tank 13 and vaporizing containers 23a and 23b. FIG. 2B is a plan view of the buffer tank 13 and vaporizing containers 23a and 23b.

Reference is made to FIG. 2A. The vaporizing container 23a and vaporizing container 23b are arranged laterally of the buffer tank 13, respectively. In Embodiment 1, the buffer tank 13, vaporizing container 23a and vaporizing container 23b are arranged in the same height position. Specifically, upper ends of the buffer tank 13, vaporizing container 23a and vaporizing container 23b are located in the same height position h1. Lower ends of the buffer tank 13, vaporizing container 23a and vaporizing container 23b are located in the same height position h2.

Reference is made to FIG. 2B. As seen, the buffer tank 13 and vaporizing containers 23a and 23b are each shaped cylindrical. The vaporizing container 23a is disposed at one side of the buffer tank 13. The vaporizing container 23b is disposed at the other side of the buffer tank 13, opposite from the vaporizing container 23a. In plan view, the vaporizing container 23a, buffer tank 13 and vaporizing container 23b are arranged in this order in a row.

The vaporizing container 23a and vaporizing container 23b are arranged in positions substantially equidistant from the buffer tank 13. FIG. 2B shows, as reference, a distance La between the center of the buffer tank 13 and the center of the vaporizing container 23a, and a distance Lb between the center of the buffer tank 13 and the center of the vaporizing container 23b. The distance La is substantially equal to the distance Lb.

The piping 25a and 25b extend linearly in a substantially horizontal direction, respectively. A length 1a of the piping 25a is substantially equal to a length 1b of the piping 25b.

The vaporizing containers 23a and 23b, when not distinguished in particular, will be written simply "vaporizing containers 23". The switch valves 27a and 27b, when not distinguished in particular, will be written simply "switch valves 27". The other switch valves 33a, 33b, 39a, 39b, 43a and 43b will similarly be written simply.

Reference is made to FIG. 1. The treating liquid vaporizing apparatus 3 further includes a controller 45. The controller 45 is electrically connected to the switch valves 17, 27, 33, 39 and 43 and level sensors 21. The controller 45 acquires detection results of the level sensors 21. The controller 45 controls operations of the switch valves 17, 27, 33, 39 and 43.

The controller 45 is realized by a central processing unit (CPU) which performs various processes, a RAM (Random-Access Memory) serving as working space for arithmetic processing, and a storage medium such as a fixed disk. The storage medium stores a variety of information such as a processing recipe (processing program) for treating the wafers W and information for identifying each wafer W.

The buffer tank 13 is an example of the tank in this invention. The switch valve 17 is an example of the tank treating liquid valve in this invention. The level sensors 21 are examples of the liquid level detecting sensor in this invention. The vaporizing containers 23a and 23b are examples of the first vaporizing container and second vaporizing container in this invention. The piping 25a and 25b are examples of the first supply pipe and second supply pipe in this invention. The switch valves 27a and 27b are examples of the first treating liquid valve and second treating liquid valve in this invention. The switch valves 33a and 33b are examples of the first vent valve and second vent valve in this invention. The switch valves 39a and 39b are examples of the first inert gas valve and second inert gas valve in this invention. The switch valves 43a and 43b are examples of the first treating gas valve and second treating gas valve in this invention.

Next, a construction of treating units 5a and 5b will be described hereinafter. The treating units 5a and 5b have the same construction.

Each treating unit 5a/5b has a plate 47, a cover 48 and a nozzle 49. The plate 47 holds a wafer W. The plate 47 has, mounted therein, a temperature control device not shown. The temperature control device adjusts the wafer W placed on the plate 47 to a predetermined temperature. The cover 48 is disposed above the plate 47. The cover 48 covers an area above the wafer W placed on the plate 47. The cover 48 is movable up and down. The nozzle 49 is attached to the cover 48. The nozzle 49 is connected to the other end of the piping 41. The nozzle 49 blows out the treating gas downward of the cover 48.

The controller 45 further controls the temperature control devices and controls the up-and-down movement of the covers 48 in the treating units 5a and 5b.

The treating units 5a and 5b are examples of the first treating unit and second treating unit in this invention. The treating units 5a and 5b, when not distinguished in particular, will be written simply "treating units 5".

Next, examples of operation of the substrate treating apparatus 1 will be described. Operation of the substrate treating apparatus 1 can be considered a combination of operation relating to the buffer tank 13, operation relating to the vaporizing container 23a, and operation relating to the vaporizing container 23b. First, each of these operations will be described separately.

<Operation Relating to Buffer Tank 13>

Reference is made to FIG. 1. The controller 45 opens and closes the switch valve 17 based on the detection results of the level sensors 21.

Specifically, the controller 45 refers to the detection result of the level sensor 21a. When the controller 45 determines that the treating liquid in the buffer tank 13 is less than the low level LL, the controller 45 will open the switch valve 17. When the switch valve 17 is open, the treating liquid is supplied from the treating liquid supply source 11 to the buffer tank 13.

The controller 45 refers to the detection result of the level sensor 21b. When the controller 45 determines that the treating liquid in the buffer tank 13 is equal to or higher than the high level HL, the controller 45 will close the switch valve 17. When the switch valve 17 is closed, it stops the supply of the treating liquid from the treating liquid supply source 11 to the buffer tank 13.

<Operation Relating to Vaporizing Container 23a>

The controller 45 controls the switch valves 27a, 33a, 39a and 43a based on the processing recipe.

Specifically, when the treating unit 5a uses the treating gas, the controller 45 closes the switch valves 27a and 33a, and opens the switch valves 39a and 43a.

When the switch valve 27a is closed, the vaporizing container 23a is separated (cut off) from the buffer tank 13 and vaporizing container 23b. When the switch valve 33a is closed, the vaporizing container 23a will be in a half-sealed state. When the switch valve 39a is open, the inert gas is sent from the gas supply source 35 to the vaporizing container 23a. The treating liquid Sa is mixed with the inert gas, and part of the treating liquid Sa vaporizes. That is, the treating gas including the vaporized treating liquid is produced in the vaporizing container 23a. When the switch valve 43a is opened, the treating gas in the vaporizing container 23a flows out of the vaporizing container 23a through the piping 41a. And the treating gas is supplied to the treating unit 5a (nozzle 49).

In the treating unit 5a, a wafer W is placed on the plate 47. The temperature of the wafer W is adjusted by the temperature control device not shown. The cover 48 covers the area above the wafer W. The nozzle 49 blows out the treating gas between the plate 47 and cover 48. The treating gas flows over the surface of the wafer W. The vaporized treating liquid in the treating gas is liquefied on the surface of the wafer W. Consequently, the treating liquid is uniformly applied over the entire surface of the wafer W. In this way, the treating unit 5a carries out hydrophobizing treatment of the wafer W.

On the other hand, when the treating unit 5a does not use the treating gas, the controller 45 opens the switch valves 27a and 33a, and closes the switch valves 39a and 43a.

When the switch valve 33a is opened, the interior of the vaporizing container 23a is opened to the exterior of the vaporizing container 23a. The gas pressure inside the vaporizing container 23a becomes substantially equal to atmospheric pressure outside the vaporizing container 23a. That is, the internal pressure of the vaporizing container 23a becomes substantially equal to the internal pressure of the buffer tank 13. When the switch valve 27a is opened, the buffer tank 13 and vaporizing container 23a communicate (are connected) with each other. Consequently, the treating liquid is supplied from the buffer tank 13 to the vaporizing container 23a. More particularly, the treating liquid naturally moves between the buffer tank 13 and vaporizing containers 23a. As a result, the liquid level of the treating liquid Ss in the buffer tank 13 and the liquid level of the treating liquid Sa in the vaporizing container 23a become equal.

When the switch valve 39a is closed, it stops the supply of the inert gas from the gas supply source 35 to the vaporizing container 23a. Consequently, the treating gas is not produced in the vaporizing container 23a. When the switch valve 43a is closed, the gas in the vaporizing container 23a does not flow out of the vaporizing container 23a through the piping 41a. That is, gas such as the treating gas is not sent from the vaporizing container 23a to the treating unit 5a.

<Operation Relating to Vaporizing Container 23b>

Operation relating to the vaporizing container 23b is substantially the same as the operation relating to the vaporizing container 23a. Therefore, the operation relating to the vaporizing container 23b will be described briefly.

The controller 45 controls the switch valves 27b, 33b, 39b, and 43b based on the processing recipe.

Specifically, when the treating unit 5b uses the treating gas, the controller 45 closes the switch valves 27b and 33b, and opens the switch valves 39b and 43b. Consequently, the vaporizing container 23b is separated from the buffer tank 13 and vaporizing container 23a. The inert gas is supplied to the vaporizing container 23b. The vaporizing container 23b vaporizes the treating liquid Sb, and produces a treating gas. The treating gas is supplied from the vaporizing container 23b to the treating unit 5b (nozzle 49). The treating unit 5b treats the wafer W using the treating gas.

On the other hand, when the treating unit 5b does not use the treating gas, the controller 45 opens the switch valves 27b and 33a, and closes the switch valves 39b and 43b. The pressure in the vaporizing container 23b becomes substantially equal to the pressure in the buffer tank 13, and the treating liquid is supplied from the buffer tank 13 to the vaporizing container 23b. The inert gas is not supplied to the vaporizing container 23b, and the vaporizing container 23b does not vaporize the treating liquid Sb. Gas such as the treating gas in the vaporizing container 23b is not sent to the treating unit 5b.

The operations relating to the buffer tank 13 and vaporizing containers 23a and 23b will now be summarized.

The operation relating to the buffer tank 13 has a mode M1 in which the treating liquid is supplied to the buffer tank 13, and a mode M2 in which the supply of the treating liquid to the buffer tank 13 is stopped. In the modes M1 and M2, the switch valve 17 operates as follows:

switch valve 17 in mode M1: opened
switch valve 17 in mode M2: closed

The operation relating to the vaporizing container 23a has a mode M3 in which the treating liquid is vaporized in the vaporizing container 23a, and a mode M4 in which the treating liquid is supplied to the vaporizing container 23a. In the modes M3 and M4, the switch valves 27a, 33a, 39a and 43a operate as follows:

switch valves 27a, 33a, 39a and 43a in mode M3: closed, closed, opened and opened
switch valves 27a, 33a, 39a and 43a in mode M4: opened, opened, closed and closed The operation relating to the vaporizing container 23b has a mode M5 in which the treating liquid is vaporized in the vaporizing container 23b, and a mode M6 in which the treating liquid is supplied to the vaporizing container 23b. In the modes M5 and M6, the switch valves 27b, 33b, 39b and 43b operate as follows:

switch valves 27b, 33b, 39b and 43b in mode M5: closed, closed, opened and opened
switch valves 27b, 33b, 39b and 43b in mode M6: opened, opened, closed and closed The operations relating to the buffer tank 13 and the vaporizing containers 23a and 23b are independent of one another. For example, the operation relating to the buffer tank 13 switches between the modes M1 and M2 regardless of the operations relating to the vaporizing containers 23a and 23b. Similarly, the operation relating to the vaporizing container 23a switches between the modes M3 and M4 regardless of the operations relating to the buffer tank 13 and vaporizing container 23b. The operation relating to the vaporizing container 23b switches between the modes M5 and M6 regardless of the operations relating to the buffer tank 13 and vaporizing container 23a. Thus, as operation of the substrate treating apparatus 1, there are eight modes. Three of the eight modes will be described by way of example hereinafter.

Figure 3:
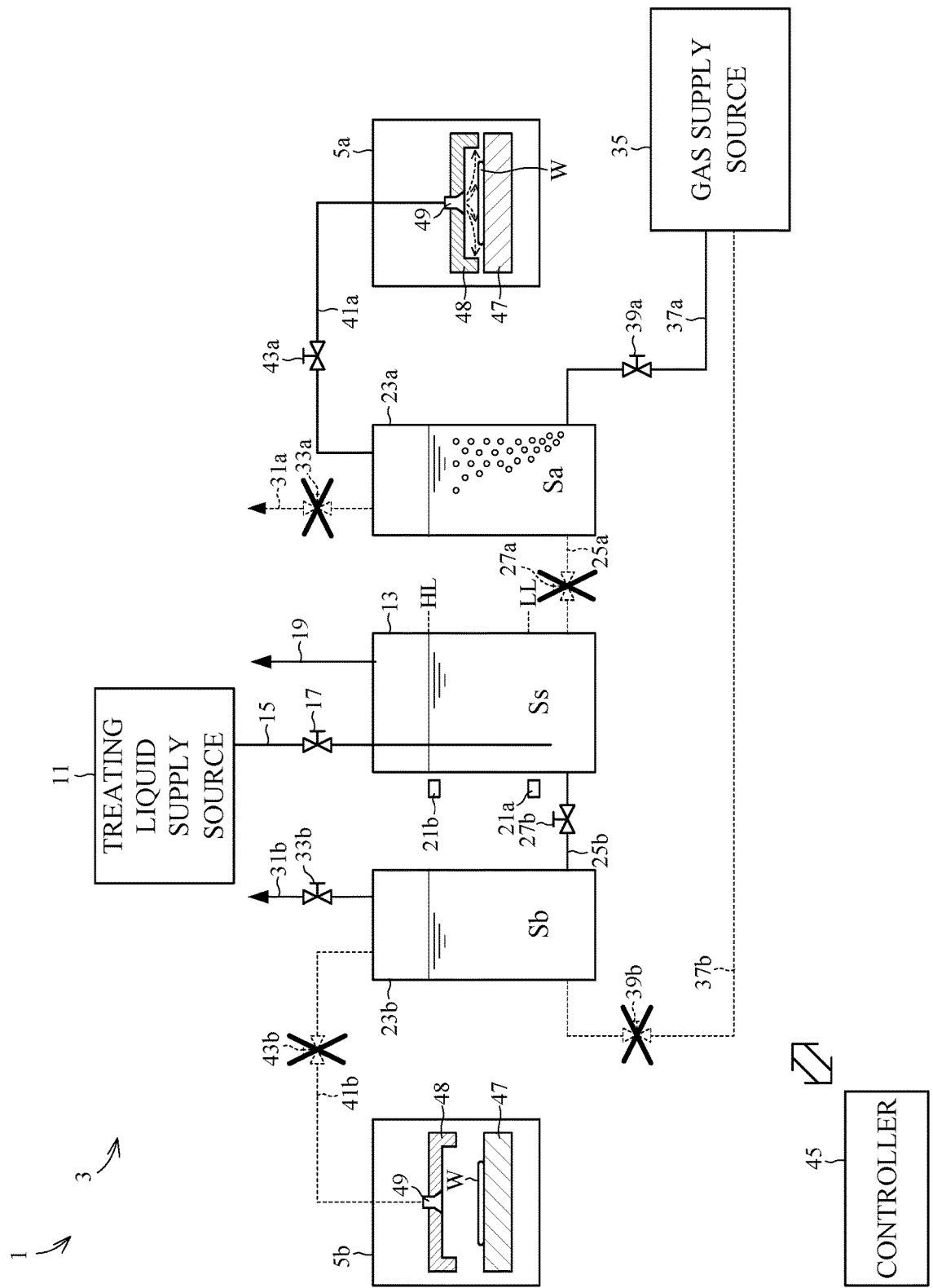
FIG. 3 is a view showing an example of operation of the substrate treating apparatus.
Figure 4:
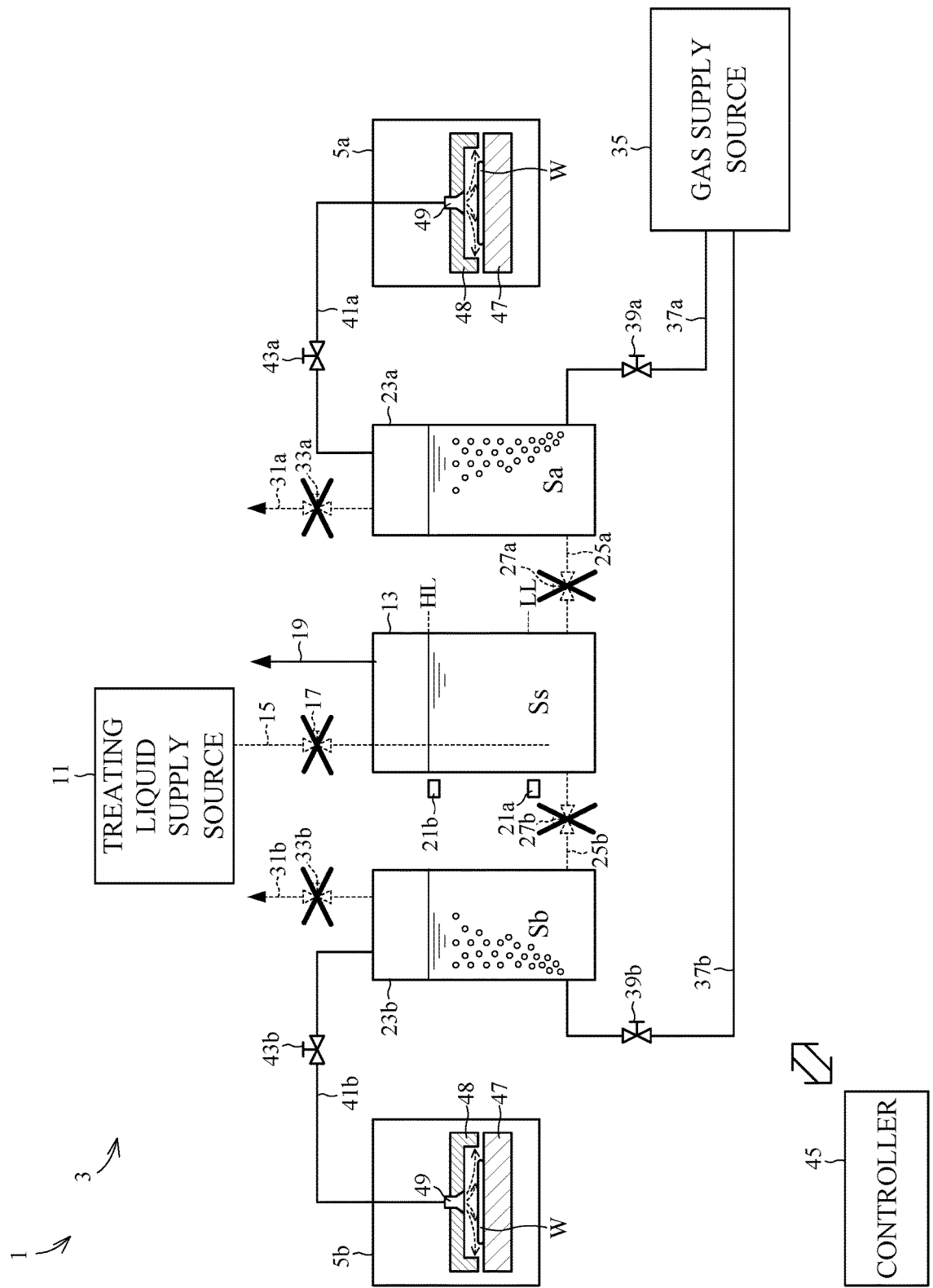
FIG. 4 is a view showing another example of operation of the substrate treating apparatus.
Figure 5:
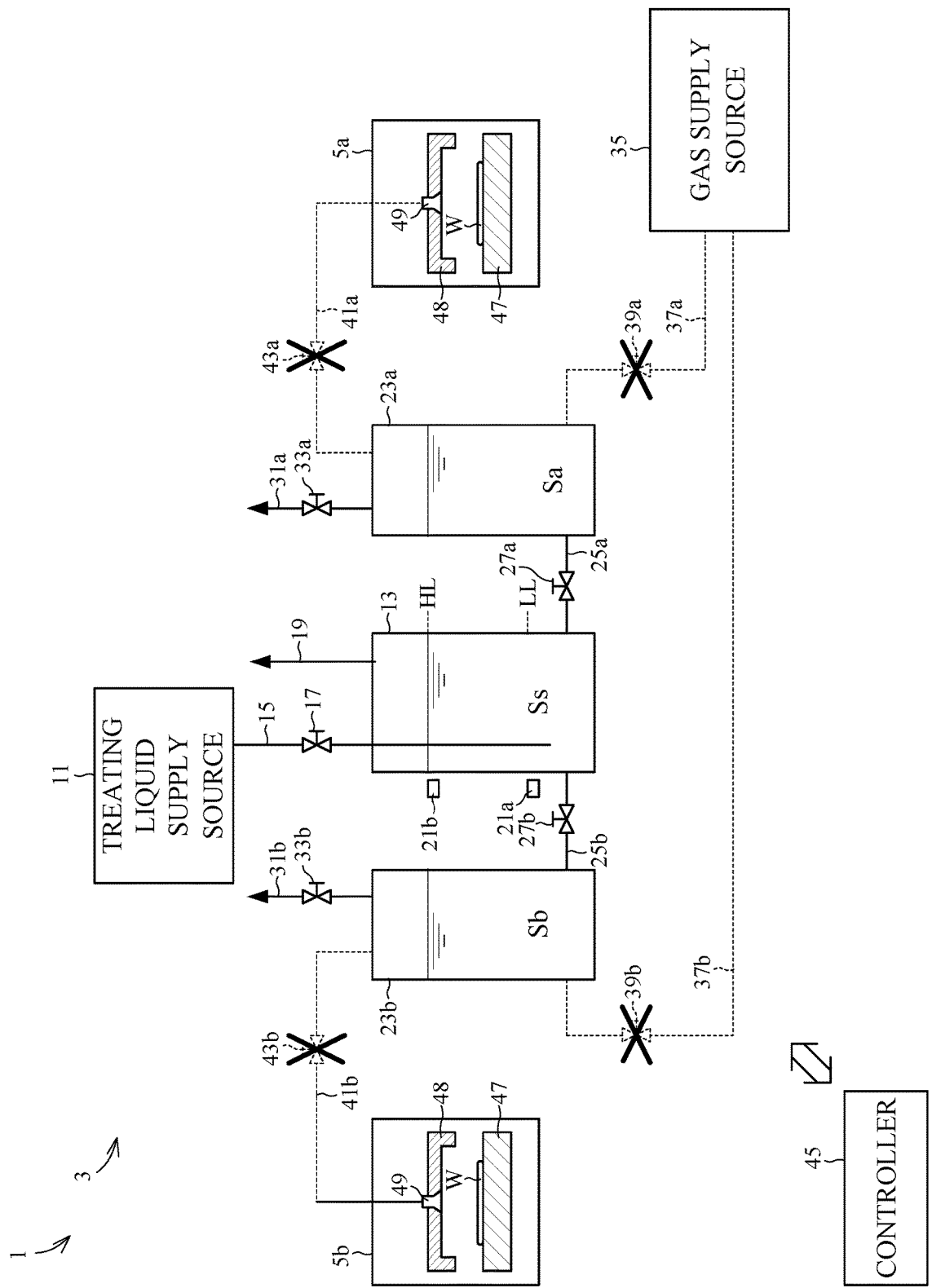
FIG. 5 is a view showing a further example of operation of the substrate treating apparatus.

FIG. 3 is a view showing example 1 of operation of the substrate treating apparatus 1. In example 1 of operation, only the vaporizing container 23a produces the treating gas. More particularly, in example 1 of operation, the treating liquid is supplied to the buffer tank 13 (mode MD, the treating liquid is vaporized in the vaporizing container 23a (mode M3), and the treating liquid is supplied to the vaporizing container 23b (mode M6). For expediency, FIG. 3 shows, in dotted lines, the closed switch valves and the piping having the closed switch valves, with "x" marks affixed to the closed switch valves. FIGS. 4 and 5 which will be described hereinafter depict the switch valves and piping in a similar way.

As shown in FIG. 3, while the treating liquid is supplied from the treating liquid supply source 11 to the buffer tank 13, the treating liquid is supplied from the buffer tank 13 to the vaporizing container 23b. The treating liquid supply source 11 supplies the treating liquid until the liquid level of the treating liquid in the buffer tank 13 reaches the high level HL. When the liquid level of the treating liquid in the buffer tank 13 reaches the high level HL, the supply of the treating liquid from the treating liquid supply source 11 to the buffer tank 13 will finish. That is, the operation relating to the buffer tank 13 switches from the mode M1 to the mode M2. At this time, the liquid level of the treating liquid Sb in the vaporizing container 23b is in the same height position as the high level HL. Thus, the treating liquid is supplied to the vaporizing container 23b until the liquid level of the treating liquid Sb in the vaporizing container 23b reaches the same height position as the high level HL.

The vaporizing container 23a is separated from the buffer tank 13 and vaporizing container 23b with the switch valve 27a acting as the boundary in between. The vaporizing container 23a vaporizes the treating liquid Sa, and produces the treating gas. The quantity of treating gas produced by the treating liquid vaporizing apparatus 3 as a whole is relatively small. The treating gas produced in the vaporizing container 23a is supplied to the treating unit 5a. FIG. 3 and other figures schematically show flows of the treating gas blown out of the nozzles 49.

Reference is made to FIG. 4. FIG. 4 is a view showing example 2 of operation of the substrate treating apparatus 1. In example 2 of operation, both of the vaporizing containers 23a and 23b produce the treating gas. More particularly, in example 2 of operation, the supply of the treating liquid to the buffer tank 13 is stopped (mode M2), the treating liquid is vaporized in the vaporizing container 23a (mode M3), and the treating liquid is vaporized in the vaporizing container 23b (mode M5).

As shown in FIG. 4, the supply of the treating liquid from the treating liquid supply source 11 to the buffer tank 13 is stopped. The vaporizing container 23a, vaporizing container 23b and buffer tank 13 are separated from one another. Specifically, the vaporizing container 23a is separated from the buffer tank 13 and vaporizing container 23b with the switch valve 27a acting as the boundary in between. The vaporizing container 23b is separated from the buffer tank 13 and vaporizing container 23a with the switch valve 27b acting as the boundary in between. Both of the vaporizing containers 23a and 23b produce the treating gas at the same time. The quantity of treating gas produced by the treating liquid vaporizing apparatus 3 as a whole is relatively large. The treating gas produced in the vaporizing container 23a is supplied to the treating unit 5a, and the treating gas produced in the vaporizing container 23b is supplied to the treating unit 5b.

Reference is made to FIG. 5. FIG. 5 is a view showing example 3 of operation of the substrate treating apparatus 1. In example 3 of operation, the treating liquid is supplied to both of the vaporizing containers 23a and 23b. More particularly, in example 3 of operation, the treating liquid is supplied to the buffer tank 13 (mode M1), the treating liquid is supplied to the vaporizing container 23a (mode M4), and the treating liquid is supplied to the vaporizing container 23b (mode M6).

As shown in FIG. 5, while the treating liquid is supplied from the treating liquid supply source 11 to the buffer tank 13, the treating liquid is supplied from the buffer tank 13 to the vaporizing containers 23a and 23b. The treating liquid is supplied from the treating liquid supply source 11 to the buffer tank 13 until the liquid level of the treating liquid in the buffer tank 13 reaches the high level HL. Along with this, the treating liquid is supplied to the vaporizing containers 23a and 23b until the liquid level in each of the vaporizing containers 23a and 23b reaches the same height position as the high level HL.

Thus, the treating liquid vaporizing apparatus 3 according to Embodiment 1 produces the following effects.

The treating liquid vaporizing apparatus 3 with the switch valve 27a can separate (cut off) the vaporizing container 23a from the buffer tank 13 and vaporizing container 23b. When the vaporizing container 23a is separated from the buffer tank 13 and vaporizing container 23b, the pressure inside the vaporizing container 23a does not vary under the influence of the buffer tank 13 and vaporizing container 23b. Under such conditions, the vaporizing container 23a can vaporize the treating liquid Sa. That is, the vaporizing container 23a can vaporize the treating liquid Sa, without being influenced by the buffer tank 13 and vaporizing container 23b. This can conveniently inhibit variations in the concentration of the treating gas in the vaporizing container 23a.

Similarly, the treating liquid vaporizing apparatus 3 with the switch valve 27b can separate the vaporizing container 23b from the buffer tank 13 and vaporizing container 23a. When the vaporizing container 23b is separated from the buffer tank 13 and vaporizing container 23a, the vaporizing container 23b can vaporize the treating liquid Sb without being influenced by the buffer tank 13 and vaporizing container 23a. This can conveniently inhibit variations in the concentration of the treating gas in the vaporizing container 23b.

The switch valves 27a and 27b can individually open and close the flow path of the treating liquid between the buffer tank 13 and vaporizing container 23a, and the flow path of the treating liquid between the buffer tank 13 and vaporizing container 23b. The treating liquid vaporizing apparatus 3 can therefore conveniently inhibit variations in the concentration of the treating gas regardless of the quantity of treating gas produced by the treating liquid vaporizing apparatus 3 as a whole.

When only one of the switch valves 27a and 27b is closed as in example 1 of operation, for example, one of the vaporizing container 23a and vaporizing container 23b is separated from the buffer tank 13 and the other vaporizing container 23a or vaporizing container 23b. Therefore, only one of the vaporizing container 23a and vaporizing container 23b can conveniently produce the treating gas. Thus, the treating liquid vaporizing apparatus 3 can conveniently inhibit variations in the concentration of the treating gas even when the quantity of treating gas produced by the treating liquid vaporizing apparatus 3 as a whole is relatively small.

When both of the switch valves 27a and 27b are closed as in example 2 of operation, for example, the vaporizing container 23a, vaporizing container 23b and buffer tank 13 are separated from one another. Therefore, both of the vaporizing containers 23a and 23b can conveniently produce the treating gas at the same time. Thus, the treating liquid vaporizing apparatus 3 can conveniently inhibit variations in the concentration of the treating gas even when the quantity of treating gas produced by the treating liquid vaporizing apparatus 3 as a whole is relatively large.

The treating liquid can be supplied individually to the vaporizing containers 23a and 23b by individually opening the switch valves 27a and 27b. For example, the treating liquid can be conveniently supplied to the vaporizing container 23a by opening the switch valve 27a. The treating liquid can be conveniently supplied to the vaporizing container 23b by opening the switch valve 27b. For example, by closing one of the switch valves 27a and 27b and opening the other of the switch valves 27a and 27b, while one of the vaporizing container 23a and vaporizing container 23b produces the treating gas, the treating liquid can be supplied to the other of the vaporizing container 23a and vaporizing container 23b. For example, when both of the switch valves 27a and 27b are opened, the treating liquid can be supplied to the vaporizing containers 23a and 23b at the same time.

The treating gas produced in the vaporizing container 23a is sent only to one treating unit 5a. In other words, the vaporizing container 23a produces only the treating gas used by one treating unit 5a. Therefore, compared with the case of one vaporizing container supplying the treating gas to a plurality of treating units, variations in the quantity of treating gas produced in the vaporizing container 23a are small. This can inhibit variations in the concentration of the treating gas in the vaporizing container 23a with increased effect. Similarly, the treating gas produced in the vaporizing container 23b is sent only to one treating unit 5b. This can inhibit variations in the concentration of the treating gas in the vaporizing container 23b with increased effect.

The interior of the buffer tank 13 is open to the exterior of the buffer tank 13, and the treating liquid vaporizing apparatus 3 has the switch valve 33a. When the switch valve 33a is opened, the internal pressure of the vaporizing container 23a becomes substantially equal to the internal pressure of the buffer tank 13. When both the switch valve 33a and switch valve 27a are opened, therefore, the treating liquid can be naturally moved between the buffer tank 13 and vaporizing container 23a without forcibly sending the treating liquid with a pump or the like. The treating liquid can be conveniently supplied to the vaporizing container 23a using such movement of the treating liquid. Similarly, the treating liquid vaporizing apparatus 3 has the switch valve 33b. When the switch valve 33b is opened, the internal pressure of the vaporizing container 23b becomes substantially equal to the internal pressure of the buffer tank 13. The treating liquid can therefore be supplied easily to the vaporizing container 23b only by opening both the switch valve 33b and switch valve 27b.

In Embodiment 1, when the switch valve 27a is open, the switch valve 33a is also open. That is, when supplying the treating liquid to the vaporizing container 23a, the internal pressure of the vaporizing container 23a is substantially equal to the internal pressure of the buffer tank 13. The treating liquid can therefore be supplied easily to the vaporizing container 23a. Similarly, when the switch valve 27b is open, the switch valve 33b is also open. The treating liquid can therefore be supplied easily to the vaporizing container 23b.

The treating liquid vaporizing apparatus 3 has no fluid machine such as a pump between the buffer tank 13 and vaporizing container 23a for forcibly sending the treating liquid. That is, the buffer tank 13 and vaporizing container 23a are connected to be in communication with each other, without any fluid machine such as a pump in between for forcibly sending the treating liquid. This can simplify the construction of the treating liquid vaporizing apparatus 3. Similarly, in the treating liquid vaporizing apparatus 3, the buffer tank 13 and vaporizing container 23b are connected to be in communication with each other, without any fluid machine such as a pump in between for forcibly sending the treating liquid. This can further simplify the construction of the treating liquid vaporizing apparatus 3.

The vaporizing container 23a is disposed laterally of the buffer tank 13. The treating liquid can therefore move easily between the buffer tank 13 and vaporizing container 23a. In Embodiment 1 in particular, the buffer tank 13 and vaporizing container 23a are arranged in the same height position. The treating liquid can therefore move still more easily between the buffer tank 13 and vaporizing container 23a.

The vaporizing container 23b is disposed laterally of the buffer tank 13. The treating liquid can therefore move easily between the buffer tank 13 and vaporizing container 23b. In Embodiment 1 in particular, the buffer tank 13 and vaporizing container 23b are arranged in the same height position. The treating liquid can therefore move still more easily between the buffer tank 13 and vaporizing container 23b.

The vaporizing container 23b is disposed laterally of the vaporizing container 23a. The treating liquid can therefore be supplied in substantially the same quantity to the vaporizing containers 23a and 23b. Thus, the conditions on which the vaporizing container 23a produces the treating gas and the conditions on which the vaporizing container 23b produces the treating gas can be approximated. Consequently, variations in the concentration of the treating gas between the vaporizing containers 23a and 23b can be inhibited conveniently.

In Embodiment 1 in particular, the vaporizing container 23a and vaporizing container 23b are arranged in the same height position. The treating liquid can therefore be supplied in substantially the same quantity to the vaporizing containers 23a and 23b. In other words, the quantity of the treating liquid Sa stored in the vaporizing container 23a and the quantity of the treating liquid Sb stored in the vaporizing container 23b can easily be made equal. Therefore, the conditions for generating the treating gas can be further approximated between the vaporizing containers 23a and 23b.

In Embodiment 1, when the switch valve 33a and switch valve 27a are open, respectively, the liquid level of the treating liquid Sa in the vaporizing container 23a becomes equal to the liquid level of the treating liquid Ss in the buffer tank 13. The treating liquid vaporizing apparatus 3 can therefore supply the treating liquid in an appropriate quantity to the vaporizing container 23a even without a sensor which directly detects the liquid level of the treating liquid Sa in the vaporizing container 23a.

Similarly, when the switch valve 33b and switch valve 27b are open, respectively, the liquid level of the treating liquid Sb in the vaporizing container 23b becomes equal to the liquid level of the treating liquid Ss in the buffer tank 13. The treating liquid vaporizing apparatus 3 can therefore, with the simple construction, supply the treating liquid in an appropriate quantity to the vaporizing container 23b.

Further, the liquid levels of the treating liquids Sa and Sb in the vaporizing containers 23a and 23b can be estimated from the liquid level of the treating liquid Ss in the buffer tank 13. In other words, the liquid level of the treating liquid Ss in the buffer tank 13 can be regarded as the liquid levels of the treating liquids Sa and Sb in the vaporizing containers 23a and 23b. Therefore, instead of directly monitoring the liquid levels of the treating liquids Sa and Sb in the vaporizing containers 23a and 23b, the liquid levels of the treating liquids Sa and Sb in the vaporizing containers 23a and 23b can be indirectly monitored by monitoring the liquid level of the treating liquid Ss in the buffer tank 13. Especially since the buffer tank 13 does not vaporize the treating liquid Ss, the liquid level of the treating liquid Ss in the buffer tank 13 is stable, with little up-and-down fluctuations. On the other hand, the vaporizing containers 23a and 23b vaporize the treating liquids Sa and Sb, wherefore the liquid levels of the treating liquids Sa and Sb in the vaporizing containers 23a and 23b are unstable with frequent up-and-down fluctuations. It is therefore easier to determine the liquid levels of the treating liquids Sa and Sb in the vaporizing containers 23a and 23b by estimating the liquid levels of the treating liquids Sa and Sb in the vaporizing containers 23a and 23b based on the detection result of the level sensor 21, than by directly detecting the liquid levels of the treating liquids Sa and Sb in the vaporizing containers 23a and 23b. The liquid levels of the treating liquids Sa and Sb in the vaporizing containers 23a and 23b can be controlled easily and properly by monitoring the liquid level of the treating liquid Ss in the buffer tank 13.

In plan view, the distance between the vaporizing container 23a and buffer tank 13 is substantially equal to the distance between the vaporizing container 23b and buffer tank 13. Therefore, the conditions for producing the treating gas in the vaporizing containers 23a and 23b can be approximated.

The piping 25a extends linearly in a substantially horizontal direction. The treating liquid can therefore move easily between the buffer tank 13 and vaporizing container 23a. Similarly, the piping 25b extends linearly in a substantially horizontal direction. The treating liquid can therefore move easily between the buffer tank 13 and vaporizing container 23b.

One end of the piping 25a is connected to the lower part of the buffer tank 13, and the other end of the piping 25a to the lower part of the vaporizing container 23a. The treating liquid can therefore move with increased ease between the buffer tank 13 and vaporizing container 23a. Similarly, one end of the piping 25b is connected to the lower part of the buffer tank 13, and the other end of the piping 25b to the lower part of the vaporizing container 23b. The treating liquid can therefore move with increased ease between the buffer tank 13 and vaporizing container 23b.

The length 1a of the piping 25a is substantially equal to the length 1b of the piping 25b. Therefore, the conditions on which the vaporizing container 23a produces the treating gas, and the conditions on which the vaporizing container 23b produces the treating gas, can easily be made equal. In other words, the conditions on which the vaporizing container 23a produces the treating gas, and the conditions on which the vaporizing container 23b produces the treating gas, can be approximated conveniently.

The treating liquid vaporizing apparatus 3 includes the switch valves 39a and 39b. The inert gas can therefore be supplied individually to the vaporizing containers 23a and 23b. For example, the inert gas can be supplied to the vaporizing containers 23a and 23b with the same timing. In this case, both of the vaporizing containers 23a and 23b can vaporize the treating-liquid at the same time. For example, the inert gas can also be supplied to the vaporizing containers 23a and 23b at different times. In this case, the vaporizing containers 23a and 23b can vaporize the treating liquid with staggered timing.

In Embodiment 1, when the switch valve 27a is open, the switch valve 39a is closed. That is, when the vaporizing container 23a is in communication with the buffer tank 13, the vaporizing container 23a does not produce the treating gas. This can prevent variations in the concentration from occurring to the treating gas in the vaporizing container 23a. Similarly, when the switch valve 27b is open, the switch valve 39b is closed. This can prevent variations in the concentration from occurring to the treating gas in the vaporizing container 23b.

Conversely, when the switch valve 39a is open, the switch valve 27a is closed. That is, when the vaporizing container 23a vaporizes the treating liquid Sa, the vaporizing container 23a is separated from the buffer tank 13 and vaporizing container 23b. This can conveniently inhibit variations in the concentration of the treating gas in the vaporizing container 23a. Similarly, when the switch valve 39b is open, the switch valve 27b is closed. This can conveniently inhibit variations in the concentration of the treating gas in the vaporizing container 23b.

When the switch valve 39a is open, the switch valve 33a is closed. That is, when the vaporizing container 23a vaporizes the treating liquid, the vaporizing container 23a is in a half-sealed state. Consequently, the vaporizing container 23a can conveniently produce the treating gas. Similarly, when the switch valve 39b is open, the switch valve 33b is closed. Consequently, the vaporizing container 23b can conveniently produce the treating gas.

The treating liquid vaporizing apparatus 3 includes the switch valves 43a and 43b. The treating gas can therefore be taken out of the vaporizing containers 23a and 23b individually. For example, the vaporizing containers 23a and 23b can output the treating gas with the same timing. For example, the vaporizing containers 23a and 23b can also output the treating gas with staggered timing.

When the switch valve 27a is open, the switch valve 43a is closed. That is, when the vaporizing container 23a is in communication with the buffer tank 13, the gas such as the treating gas in the vaporizing container 23a does not flow out of the vaporizing container 23a through the piping 41a. This can prevent the treating gas in varying concentrations from flowing out of the vaporizing container 23a through the piping 41a. Similarly, when the switch valve 27b is open, the switch valve 43b is closed. This can prevent the treating gas in varying concentrations from flowing out of the vaporizing container 23b through the piping 41b.

Conversely, when the switch valve 43a is open, the switch valve 27a is closed. That is, when the treating gas in the vaporizing container 23a flows out of the vaporizing container 23a through the piping 41a, the vaporizing container 23a is separated from the buffer tank 13 and vaporizing container 23b. This can conveniently inhibit variations in the concentration of the treating gas outputted from the vaporizing container 23a. Similarly, when the switch valve 43b is open, the switch valve 27b is closed. This can conveniently inhibit variations in the concentration of the treating gas outputted from the vaporizing container 23b.

The treating liquid vaporizing apparatus 3 includes the switch valve 17. This conveniently enables switching between supply and stopping of the treating liquid from the treating liquid supply source 11 to the buffer tank 13.

The treating liquid vaporizing apparatus 3 includes the level sensors 21, and opens and closes the switch valve 17 based on the detection results of the level sensors 21. The treating liquid can therefore be supplied from the treating liquid supply source 11 to the buffer tank 13 at appropriate times.

The substrate treating apparatus 1 includes the treating unit 5a and the treating unit 5b different from the treating unit 5a. The treating unit 5a treats wafers W using the treating gas produced by the vaporizing container 23a. This can keep the quality of treatment in the treating unit 5a excellent. Similarly, the treating unit 5b treats wafers W using the treating gas produced by the vaporizing container 23b. This can keep the quality of treatment in the treating unit 5b excellent.

Embodiment 2

Embodiment 2 of this invention will be described hereinafter with reference to the drawings.

Figure 6:
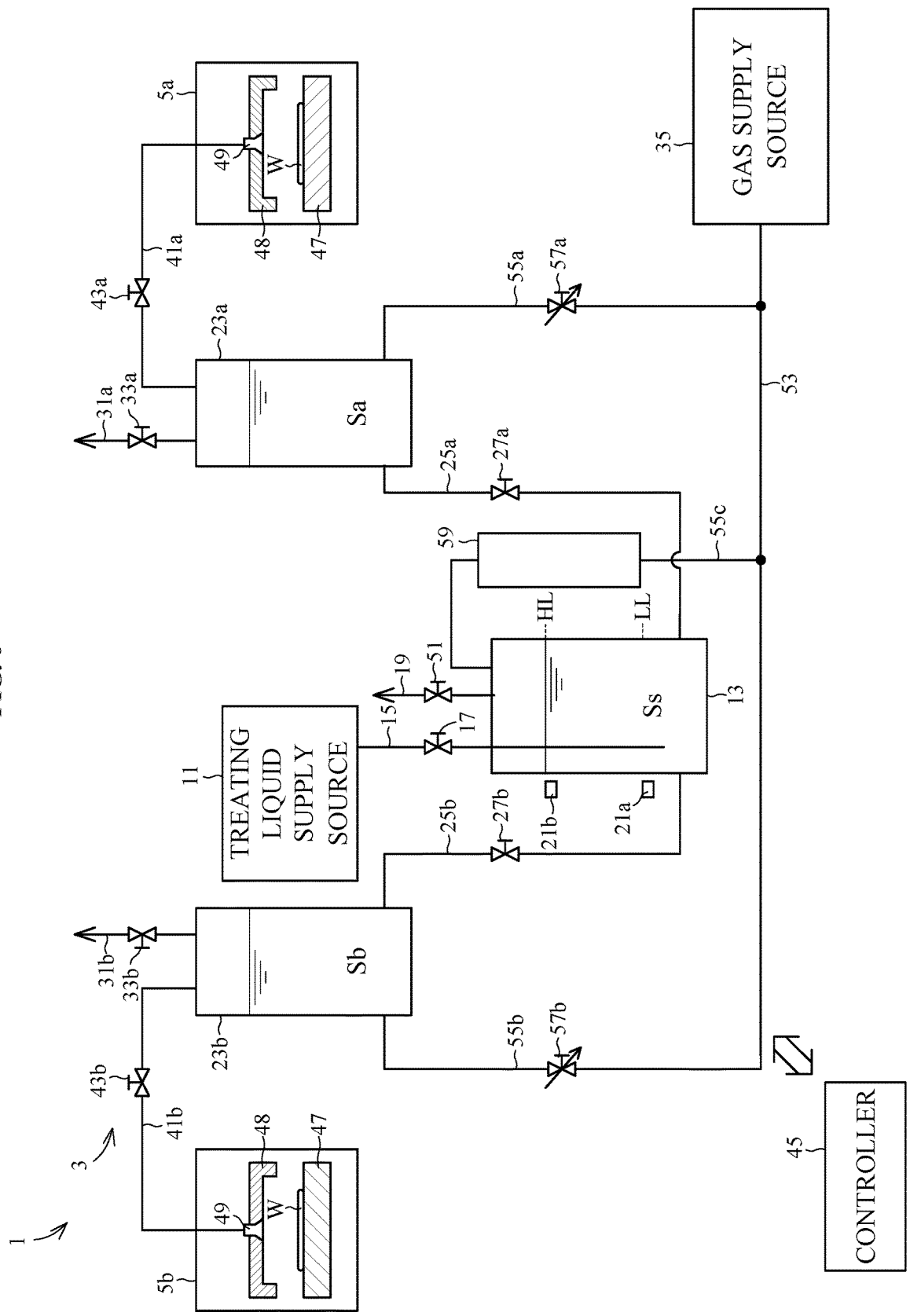
FIG. 6 is a view showing a construction of a substrate treating apparatus according to Embodiment 2.

FIG. 6 is a view showing a construction of a substrate treating apparatus according to Embodiment 2. Components identical to those of Embodiment 1 are shown with the same signs, and will not particularly be described.

The substrate treating apparatus 1 in Embodiment 2 includes a treating liquid vaporizing apparatus 3 and treating units 5a and 5b. The treating liquid vaporizing apparatus 3 in Embodiment 2 is different in construction from the treating liquid vaporizing apparatus 3 in Embodiment 1. The treating units 5a and 5b in Embodiment 2 have the same construction as the treating units 5a and 5b in Embodiment 1. The construction of the treating liquid vaporizing apparatus 3 will be described hereinafter.

The treating liquid vaporizing apparatus 3 includes a switch valve 51. The switch valve 51 is mounted on the piping 19. The switch valve 51 is operable to open and close the interior of the buffer tank 13 to the exterior of the vaporizing container 13.

The treating liquid vaporizing apparatus 3 includes a common pipe 53 and branch pipes 55a, 55b and 55c. The common pipe 53 is connected to be in communication with the gas supply source 35. One end of each of the branch pipes 55a, 55b and 55c is connected to be in communication with the common pipe 53. The other end of the branch pipe 55a is connected to the lower part of the vaporizing container 23a. The other end of the branch pipe 55b is connected to the lower part of the vaporizing container 23b. The other end of the branch pipe 55c is connected to the upper part of the buffer tank 13.

The treating liquid vaporizing apparatus 3 includes flow regulating valves 57a and 57b. The flow regulating valve 57a is mounted on the branch pipe 55a. The flow regulating valve 57a opens and closes the flow path of the inert gas between the gas supply source 35 and vaporizing container 23a. The flow regulating valve 57a regulates the flow rate of the inert gas supplied to the vaporizing container 23a. The flow regulating valve 57b is mounted on the branch pipe 55b. The flow regulating valve 57b opens and closes the flow path of the inert gas between the gas supply source 35 and vaporizing container 23b. The flow regulating valve 57b regulates the flow rate of the inert gas supplied to the vaporizing container 23b.

The treating liquid vaporizing apparatus 3 includes a regulator 59. The regulator 59 is mounted on the branch pipe 55c. The regulator 59 regulates the inert gas to a predetermined pressure and supplies it to the buffer tank 13. Consequently, the regulator 59 regulates the pressure inside the buffer tank 13.

The controller 45 further controls the switch valve 51, flow regulating valves 57a and 57b and regulator 59.

Figure 7:
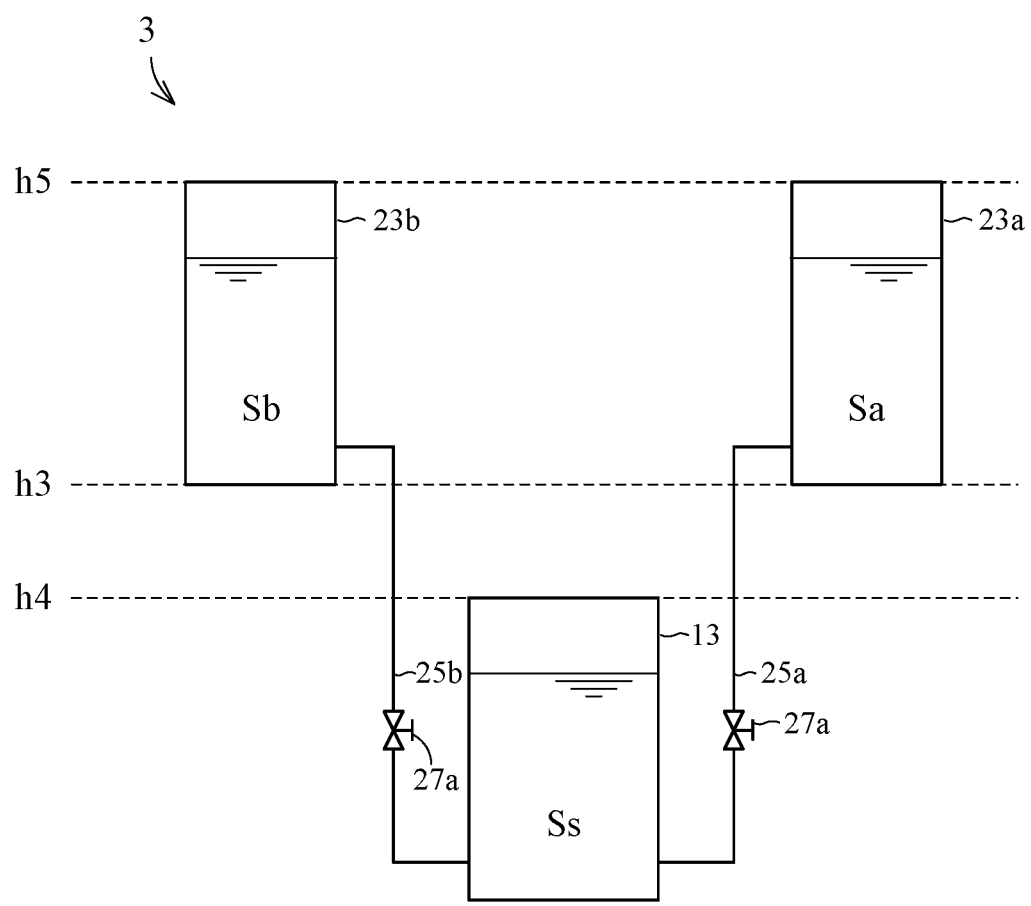
FIG. 7 is a front view of a buffer tank and vaporizing containers.

A positional relationship between the buffer tank 13 and vaporizing containers 23a and 23b will be described. FIG. 7 is a front view of the buffer tank 13 and vaporizing containers 23a and 23b.

The vaporizing container 23a and vaporizing container 23b are arranged in positions higher than the buffer tank 13. Specifically, the lower end of the vaporizing container 23a and the lower end of the vaporizing container 23b are higher than the upper end of the buffer tank 13. FIG. 7 shows a height position h3 of the lower end of the vaporizing container 23a and the lower end of the vaporizing container 23b, and a height position h4 of the upper end of the buffer tank 13. The height position h3 is higher than the height position h4.

The vaporizing container 23a and vaporizing container 23b are arranged in the same height position. Specifically, the upper ends of the vaporizing containers 23a and 23b are arranged in the same height position h5. The lower ends of the vaporizing containers 23a and 23b are arranged in the same height position h3.

The flow regulating valves 57a and 57b are examples of the first inert gas valve and the second inert gas valve in this invention. The regulator 59 is an example of the pressure regulator in this invention.

Next, examples of operation of the substrate treating apparatus 1 will be described. Operation relating to each of the buffer tank 13 and vaporizing containers 23a and 23b will be described separately.

<Operation Relating to Buffer Tank 13>

Reference is made to FIG. 6. The controller 45 controls the switch valves 17 and 51 and regulator 59 based on the detection results of the level sensors 21.

Specifically, when the controller 45 determines that the treating liquid Ss in the buffer tank 13 is less than the low level LL, the controller 45 will open the switch valves 17 and 51. The controller 45 also stops supply of the inert gas from the regulator 59 to the buffer tank 13. Consequently, the pressure inside the buffer tank 13 becomes substantially equal to the pressure outside the buffer tank 13. The treating liquid is supplied from the treating liquid supply source 11 to the buffer tank 13.

The controller 45 refers to the detection result of the level sensor 21b. When the controller 45 determines that the treating liquid Ss in the buffer tank 13 is equal to or higher than the high level 1-IL, the controller 45 will close the switch valve 17. When the switch valve 17 is closed, it stops the supply of the treating liquid from the treating liquid supply source 11 to the buffer tank 13.

<Operation Relating to Vaporizing Container 23a>

The controller 45 controls the switch valves 27a, 33a, 43a and 51, flow regulating valve 57a and regulator 59 based on the processing recipe.

Specifically, when the treating unit 5a uses the treating gas, the controller 45 closes the switch valves 27a and 33a, and opens the switch valve 43a. Further, the controller 45 regulates an amount of opening of the flow regulating valve 57a.

By regulating the amount of opening of the flow regulating valve 57a, the inert gas is sent at a predetermined flow rate to the vaporizing container 23a. Consequently, the vaporizing container 23a can produce the treating gas in a predetermined concentration. Further, the flow rate of the inert gas sent to the vaporizing container 23a is regulated by regulating the amount of opening of the flow regulating valve 57a. Consequently, the concentration of the treating gas in the vaporizing container 23a can be regulated conveniently.

On the other hand, when the treating unit 5a does not use the treating gas, the controller 45 opens the switch valves 27a and 33a, and closes the switch valve 43a and flow regulating valve 57a. Further, the controller 45 closes the switch valve 51 and controls the regulator 59.

When the switch valve 51 is closed, the buffer tank 13 will be in a half-sealed state. When the switch valve 33a is opened, the internal pressure of the vaporizing container 23a becomes substantially equal to the pressure outside the vaporizing container 23a. The gas pressure inside the buffer tank 13 is regulated by controlling the regulator 59. Specifically, the internal pressure of the buffer tank 13 is made higher than the internal pressure of the vaporizing container 23a. The difference between the internal pressure of the buffer tank 13 and the internal pressure of the vaporizing container 23a (hereinafter called "pressure difference" as appropriate) forcibly moves the treating liquid from the buffer tank 13 to the vaporizing container 23a. The treating liquid moves from the buffer tank 13 to the vaporizing container 23a until the liquid level of the treating liquid Sa in the vaporizing container 23a reaches a height position corresponding to the pressure difference. The movement of the treating liquid will stop when the liquid level of the treating liquid Sa in the vaporizing container 23a reaches the height position corresponding to the pressure difference. The treating liquid is supplied to the vaporizing container 23a in this way.

<Operation Relating to Vaporizing Container 23b>

Operation relating to the vaporizing container 23b is substantially the same as the operation relating to the vaporizing container 23a. Therefore, the operation relating to the vaporizing container 23b will be described briefly.

The controller 45 controls the switch valves 27b, 33b, 43b and 51, flow regulating valve 57b and regulator 59 based on the processing recipe.

Specifically, when the treating unit 5b uses the treating gas, the controller 45 closes the switch valves 27b and 33b, and opens the switch valve 43b. Further, the controller 45 regulates an amount of opening of the flow regulating valve 57b. Consequently, the vaporizing container 23b can produce the treating gas in a predetermined concentration. Further, the concentration of the treating gas in the vaporizing container 23b is regulated.

On the other hand, when the treating unit 5b does not use the treating gas, the controller 45 opens the switch valves 27b and 33b, and closes the switch valve 43b and flow regulating valve 57b. Further, the controller 45 closes the switch valve 51 and controls the regulator 59.

The buffer tank 13 becomes the half-sealed state. The regulator 59 regulates the gas pressure inside the buffer tank 13. The interior of the vaporizing container 23b is opened to the exterior of the vaporizing container 23b. The difference between the internal pressure of the buffer tank 13 and the internal pressure of the vaporizing container 23b (hereinafter called "pressure difference" as appropriate) forcibly moves the treating liquid from the buffer tank 13 to the vaporizing container 23b. The movement of the treating liquid continues until the liquid level of the treating liquid Sb in the vaporizing container 23b reaches a height position corresponding to the pressure difference. The movement of the treating liquid will stop when the liquid level of the treating liquid Sb in the vaporizing container 23b reaches the height position corresponding to the pressure difference. The treating liquid is supplied to the vaporizing container 23b in this way.

The operation relating to the buffer tank 13 and the operations relating to the vaporizing containers 23a and 23b can be combined as follows. When the treating liquid is supplied to the buffer tank 13, at least one of the vaporizing container 23a and vaporizing container 23b may produce the treating gas. However, when the treating liquid is supplied to the buffer tank 13, the treating liquid can be supplied to neither of the vaporizing containers 23a and 23b. When the supply of the treating liquid to the buffer tank 13 is stopped, at least one of the vaporizing container 23a and vaporizing container 23b may produce the treating gas. Further, when the supply of the treating liquid to the buffer tank 13 is stopped, the treating liquid may be supplied to at least one of the vaporizing container 23a and vaporizing container 23b.

Thus, the substrate treating apparatus 1 and treating liquid vaporizing apparatus 3 in Embodiment 2, with the switch valves 27, can also produce the same effects as in Embodiment 1. That is, the apparatus 1 and 3 can conveniently inhibit variations in the concentration of the treating gas produced by the vaporizing containers 23a and 23b. The quality of treatment in the treating units 5 can also be kept excellent.

The treating liquid vaporizing apparatus 3 with the flow regulating valve 57a can inhibit with increased effect variations in the concentration of the treating gas in the vaporizing container 23a. Similarly, the treating liquid vaporizing apparatus 3 with the flow regulating valve 57b can inhibit with increased effect variations in the concentration of the treating gas in the vaporizing container 23b.

The treating liquid vaporizing apparatus 3 with the regulator 59 can conveniently regulate the pressure in the buffer tank 13. Regulating the pressure in the buffer tank 13 can produce a pressure difference between the buffer tank 13 and vaporizing containers 23 (hereinafter written simply "pressure difference" as appropriate). The pressure difference can conveniently be regulated by regulating the pressure in the buffer tank 13. By using this pressure difference, the treating liquid can be moved forcibly from the buffer tank 13 to the vaporizing containers 23. Therefore, the treating liquid can conveniently be supplied to the vaporizing containers 23.

Specifically, when the switch valve 27a is opened and the regulator 59 is operated to regulate the pressure in the buffer tank 13, the treating liquid is forcibly moved from the buffer tank 13 to the vaporizing container 23a. Consequently, the treating liquid can conveniently be supplied to the vaporizing container 23a. Similarly, when the switch valve 27b is opened and the regulator 59 is operated to regulate the pressure in the buffer tank 13, the treating liquid can conveniently be supplied to the vaporizing container 23b.

The liquid level of the treating liquid in the vaporizing container 23a can be regulated by regulating the pressure in the buffer tank 13. For example, when the regulator 59 increases the pressure in the buffer tank 13, the liquid level of the treating liquid Sa in the vaporizing container 23a can be raised. For example, when the regulator 59 reduces the pressure in the buffer tank 13, the liquid level of the treating liquid Sa in the vaporizing container 23a can be lowered. Similarly, the liquid level of the treating liquid Sb in the vaporizing container 23b can be regulated by regulating the pressure in the buffer tank 13.

Further, the feature that the treating liquid can be supplied forcibly to the vaporizing containers 23 provides a high degree of freedom for arranging the vaporizing containers 23 relative to the buffer tank 13. As in Embodiment 2, for example, the vaporizing container 23a can be disposed in the position higher than the buffer tank 13. Similarly, the vaporizing container 23b can be disposed in the position higher than the buffer tank 13.

Embodiment 3

Embodiment 3 of this invention will be described hereinafter with reference to the drawings.

Figure 8:
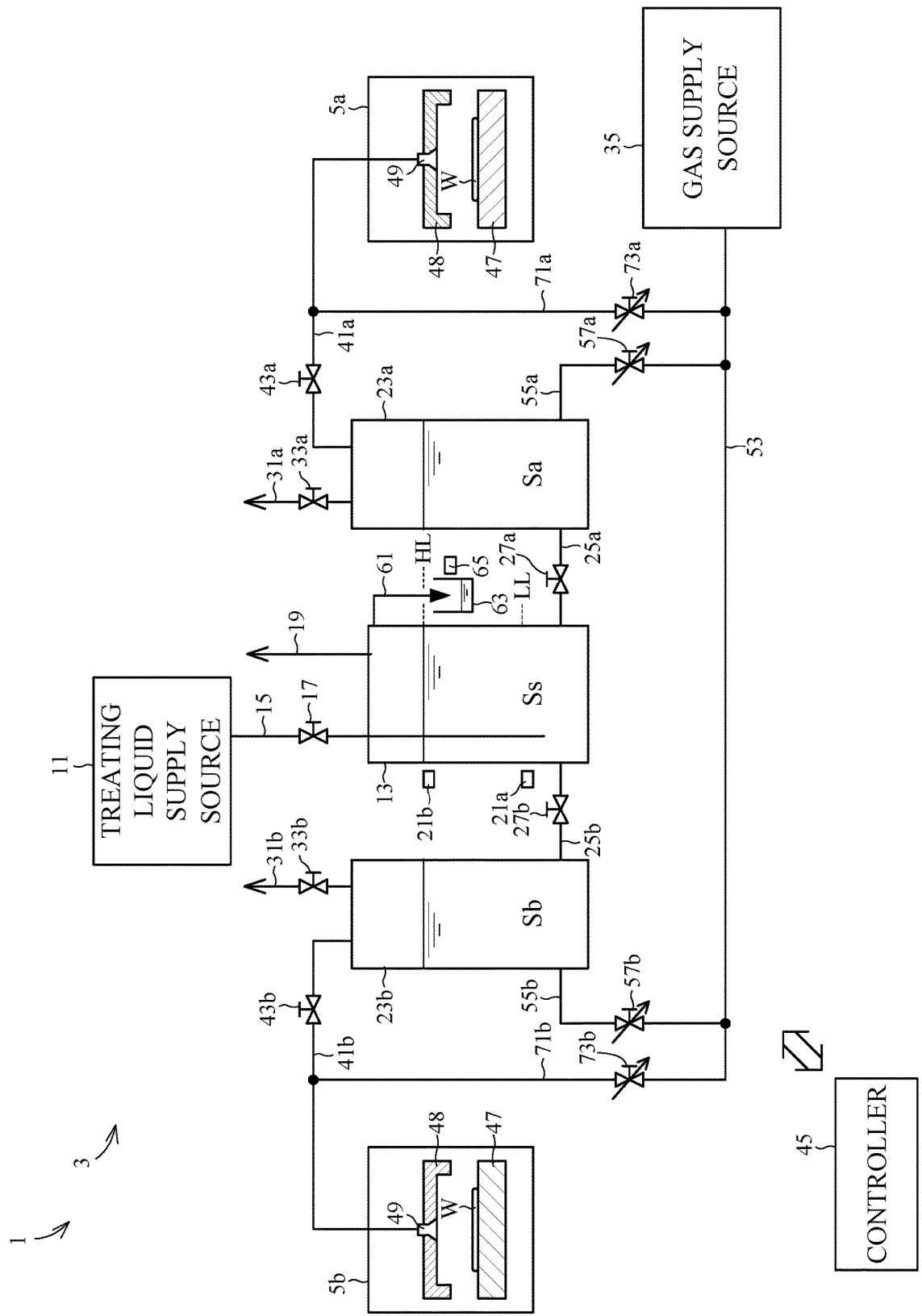
FIG. 8 is a view showing a construction of a substrate treating apparatus according to Embodiment 3.

FIG. 8 is a view showing a construction of a substrate treating apparatus according to Embodiment 3. Components identical to those of Embodiments 1 and 2 are shown with the same signs, and will not particularly be described.

The substrate treating apparatus 1 in Embodiment 3 includes a treating liquid vaporizing apparatus 3 and treating units 5a and 5b. The treating liquid vaporizing apparatus 3 in Embodiment 3 is different in construction from the treating liquid vaporizing apparatus 3 in Embodiment 1. The treating units 5a and 5b in Embodiment 3 have the same construction as the treating units 5a and 5b in Embodiment 1. The construction of the treating liquid vaporizing apparatus 3 will be described hereinafter.

The treating liquid vaporizing apparatus 3 includes a drain pipe 61, a drain pan 63 and a liquid detecting sensor 65. The drain pipe 61 discharges the treating liquid overflowing the buffer tank 13. The drain pipe 61 is connected to an upper part of the buffer tank 13. The drain pan 63 receives the liquid discharged from the drain pipe 61. The liquid detecting sensor 65 is attached to the drain pan 63. The liquid detecting sensor 65 detects whether or not liquid is present in the drain pan 63.

The treating liquid vaporizing apparatus 3 includes a common pipe 53 and branch pipes 55a, 55b, 71a and 71b. The common pipe 53 and branch pipes 55a and 55b are the same as those described in Embodiment 2. One end of each of the branch pipes 71a and 71b is connected to be in communication with the common pipe 53. The other end of the branch pipe 71a is connected to an intermediate part of the piping 41a. The other end of the branch pipe 71b is connected to an intermediate part of the piping 41b.

The treating liquid vaporizing apparatus 3 includes flow regulating valves 57a, 57b, 73a and 73b. The flow regulating valves 57a and 57b are the same as those described in Embodiment 2. The flow regulating valve 73a is mounted on the branch pipe 71a. The flow regulating valve 73a opens and closes a flow path in the branch pipe 71a. The flow regulating valve 73a opens when the switch valve 43a is open. Consequently, the inert gas for attenuating the treating gas flows from the branch pipe 71a into the piping 41a. The flow path in the branch pipe 71a is a flow path of the inert gas for attenuating the treating gas outputted from the vaporizing container 23a. Further, the flow regulating valve 73a regulates the flow rate of the inert gas flowing through the flow path in the branch pipe 71a. That is, the flow regulating valve 73a regulates the flow rate of the inert gas for attenuating the treating gas outputted from the vaporizing container 23a. The flow regulating valve 73b is mounted on the branch pipe 71b. The flow regulating valve 73b opens and closes a flow path of the inert gas for attenuating the treating gas outputted from the vaporizing container 23b. The flow regulating valve 73b opens when the switch valve 43b is open. Further, the flow regulating valve 73b regulates the flow rate of the inert gas for attenuating the treating gas outputted from the vaporizing container 23b.

The controller 45 further acquires detection results of the liquid detecting sensor 65. The controller 45 further controls the flow regulating valves 57a, 57b, 73a and 73b.

Figure 9:
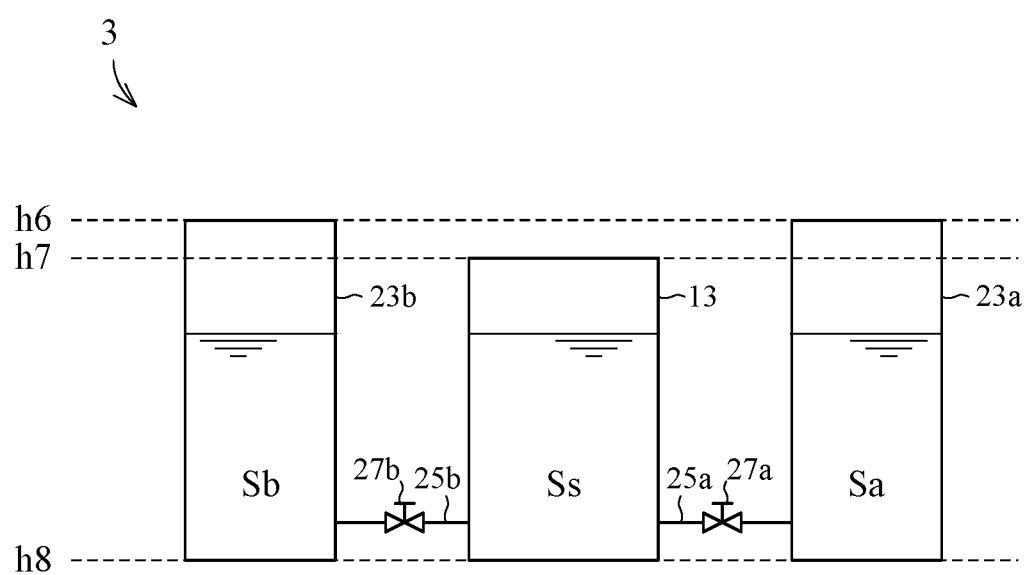
FIG. 9 is a front view of a buffer tank and vaporizing containers.

A positional relationship between the buffer tank 13 and vaporizing containers 23a and 23b will be described. FIG. 9 is a front view of the buffer tank 13 and vaporizing containers 23a and 23b.

The upper end of the vaporizing container 23a and the upper end of the vaporizing container 23b are both higher than the upper end of the buffer tank 13. FIG. 9 shows a height position h6 of the upper end of the vaporizing container 23a and the upper end of the vaporizing container 23b, and a height position h7 of the upper end of the buffer tank 13. The height position h6 is higher than the height position h7. The lower ends of the buffer tank 13 and the vaporizing containers 23a and 23b are arranged in the same height position h8.

The liquid detecting sensor 65 is an example of the overflow sensor in this invention. The flow regulating valves 73a and 73b are examples of the first attenuation valve and second attenuation valve in this invention.

Next, examples of operation of the substrate treating apparatus 1 will be described. First, operation relating to each of the buffer tank 13 and vaporizing containers 23a and 23b will be described separately.

<Operation Relating to Buffer Tank 13>

Reference is made to FIG. 8. The controller 45 controls the switch valve 17 based on the detection results of the level sensors 21 and liquid detecting sensor 65.

Specifically, when the controller 45 refers to the detection result of the level sensor 21a and determines that the treating liquid Ss in the buffer tank 13 is less than the low level LL, the controller 45 will open the switch valve 17. Consequently, the treating liquid is supplied from the treating liquid supply source 11 to the buffer tank 13.

The controller 45 refers to the detection result of the level sensor 21b. When the controller 45 determines that the treating liquid Ss in the buffer tank 13 is equal to or higher than the high level HL, the controller 45 will close the switch valve 17. This stops the supply of the treating liquid from the treating liquid supply source 11 to the buffer tank 13.

When the liquid detecting sensor 65 detects presence of liquid in the drain pan 63, the controller 45 determines that the treating liquid is overflowing the buffer tank 13. When the controller 45 determines that the treating liquid is overflowing the buffer tank 13, the controller 45 will close the switch valve 17. This stops the supply of the treating liquid from the treating liquid supply source 11 to the buffer tank 13.

<Operation Relating to Vaporizing Container 23a>

The controller 45 controls the switch valves 27a, 33a and 43a and flow regulating valves 57a and 73a based on the detecting result of the liquid detecting sensor 65 and on the processing recipe.

Specifically, when the treating unit 5a uses the treating gas, the controller 45 closes the switch valves 27a and 33a, and opens the switch valve 43a. Further, the controller 45 regulates amounts of opening of the flow regulating valves 57a and 73a.

By regulating the amount of opening of the flow regulating valve 57a, the inert gas is sent at a predetermined flow rate to the vaporizing container 23a. Consequently, the vaporizing container 23a can produce the treating gas in a predetermined concentration. Further, the flow rate of the inert gas sent to the vaporizing container 23a is regulated by regulating the amount of opening of the flow regulating valve 57a. Consequently, the concentration of the treating gas in the vaporizing container 23a can be regulated conveniently.

By opening the switch valve 43a, the treating gas in the vaporizing container 23a flows out of the vaporizing container 23a through the piping 41a.

By regulating the amount of opening of the flow regulating valve 73a, the treating gas outputted from the vaporizing container 23a joins the inert gas flowing at the predetermined flow rate through the branch pipe 71a. This realizes lowering of the concentration of the treating gas outputted from the vaporizing container 23a (that is, the treating gas can be attenuated). Further, the flow rate of the inert gas for attenuating the treating gas is regulated by regulating the amount of opening of the flow regulating valve 73a. Consequently, the concentration of the treating gas after attenuation can be regulated conveniently.

On the other hand, when the treating unit 5a does not use the treating gas, the controller 45 opens the switch valves 27a and 33a, and closes the switch valve 43a and flow regulating valves 57a and 73a. Consequently, the treating liquid moves naturally from the buffer tank 13 to the vaporizing container 23a. However, when the controller 45 refers to the detection result of the liquid detecting sensor 65 and determines that the treating liquid overflows the buffer tank 13, the controller 45 will close the switch valve 27a. This stops the supply of the treating liquid from the buffer tank 13 to the vaporizing container 23a.

<Operation Relating to Vaporizing Container 23b>

Operation relating to the vaporizing container 23b is substantially the same as the operation relating to the vaporizing container 23a. Therefore, the operation relating to the vaporizing container 23b will be described briefly.

The controller 45 controls the switch valves 27b, 33b and 43b and flow regulating valves 57b and 73b based on the processing recipe.

Specifically, when the treating unit 5b uses the treating gas, the controller 45 closes the switch valves 27b and 33b, opens the switch valve 43b, and regulates amounts of opening of the flow regulating valves 57b and 73b. By regulating the amount of opening of the flow regulating valve 57b, the inert gas is sent at a predetermined flow rate to the vaporizing container 23b. Further, the flow rate of the inert gas sent to the vaporizing container 23b is regulated by regulating the amount of opening of the flow regulating valve 57b. By regulating the amount of opening of the flow regulating valve 73b, the inert gas flowing at the predetermined flow rate attenuates the treating gas outputted from the vaporizing container 23b. Further, the flow rate of the inert gas for attenuating the treating gas is regulated by regulating the amount of opening of the flow regulating valve 73b.

On the other hand, when the treating unit 5b does not use the treating gas, the controller 45 opens the switch valve 33b, and closes the switch valve 43b and flow regulating valves 57b and 73b. Further, the controller 45 refers to the detection result of the liquid detecting sensor 65. The controller 45, when it determines that the treating liquid is overflowing the buffer tank 13, close the switch valve 27b, and when it determines that the treating liquid is not overflowing the buffer tank 13, opens the switch valve 27b. Consequently, the treating liquid is supplied from the buffer tank 13 to the vaporizing container 23b unless the treating liquid is overflowing the buffer tank 13. When the treating liquid is overflowing the buffer tank 13, the treating liquid is not supplied from the buffer tank 13 to the vaporizing container 23b.

The operations relating to the buffer tank 13 and the vaporizing containers 23a and 23b are independent of one another. For example, when the treating liquid is supplied to the buffer tank 13, at least one of the vaporizing containers 23a and 23b may produce the treating gas, or the treating liquid may be supplied to at least one of the vaporizing containers 23a and 23b. When the supply of the treating liquid to the buffer tank 13 is stopped, at least one of the vaporizing containers 23a and 23b may produce the treating gas, or the treating liquid may be supplied to at least one of the vaporizing containers 23a and 23b.

Thus, the substrate treating apparatus 1 and treating liquid vaporizing apparatus 3 in Embodiment 3, with the switch valves 27, can also produce the same effects as in Embodiment 1. That is, the apparatus 1 and 3 can conveniently inhibit variations in the concentration of the treating gas. The quality of treatment in the treating units 5 can also be kept excellent.

The treating liquid vaporizing apparatus 3 with the flow regulating valve 57a can inhibit with increased effect variations in the concentration of the treating gas in the vaporizing container 23a. Similarly, the treating liquid vaporizing apparatus 3 with the flow regulating valve 57b can inhibit with increased effect variations in the concentration of the treating gas in the vaporizing container 23b.

The treating liquid vaporizing apparatus 3 with the flow regulating valve 73a can conveniently attenuate the treating gas outputted from the vaporizing container 23a. The degree of attenuating the treating gas can also be regulated conveniently. Similarly, the treating liquid vaporizing apparatus 3 with the flow regulating valve 73b can conveniently attenuate the treating gas outputted from the vaporizing container 23b. The degree of attenuating the treating gas can also be regulated conveniently.

The treating liquid vaporizing apparatus 3 with the liquid detecting sensor 65 can conveniently detect the treating liquid overflowing the buffer tank 13. When it is determined based on the detecting result of the liquid detecting sensor 65 that the treating liquid is overflowing the buffer tank 13, the switch valves 27a and 27b are closed. This can prevent the treating liquid from overflowing the vaporizing containers 23a and 23b.

Since the upper end of the vaporizing container 23a is higher than the upper end of the buffer tank 13, even if the treating liquid Ss overflows the buffer tank 13, the treating liquid Sa can be conveniently prevented from overflowing the vaporizing container 23a. Similarly, since the upper end of the vaporizing container 23b is higher than the upper end of the buffer tank 13, even if the treating liquid Ss overflows the buffer tank 13, the treating liquid Sb can be conveniently prevented from overflowing the vaporizing container 23b.

Figure 10:
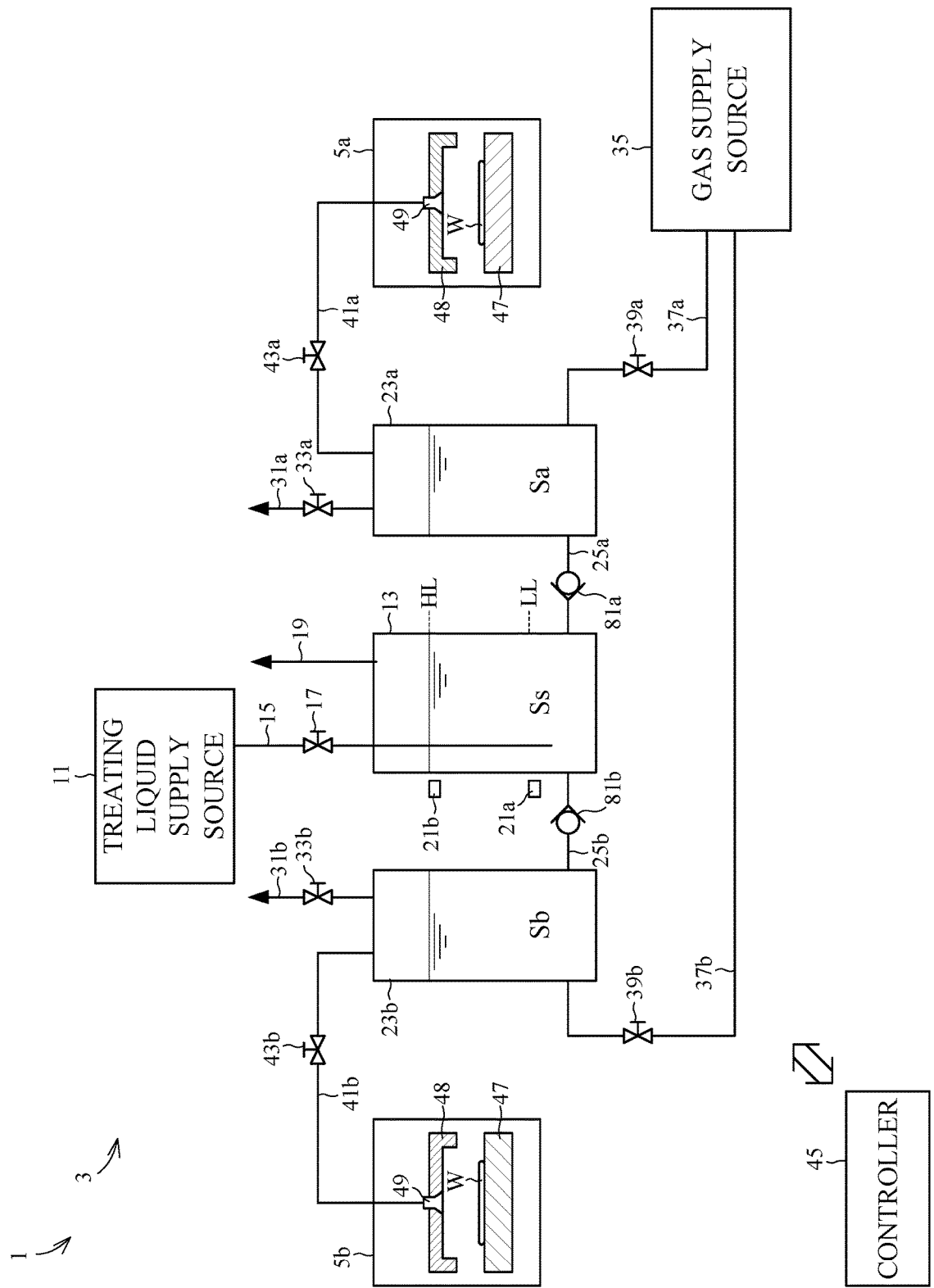
FIG. 10 is a view showing a construction of a substrate treating apparatus according to a modified embodiment.

This invention is not limited to the foregoing embodiments, but may be modified as follows:

(1) In each foregoing embodiment, the switch valves 27a and 27b may be replaced with check valves. Reference is made to FIG. 10. FIG. 10 is a view showing a construction of a substrate treating apparatus 1 according to a modified embodiment. The substrate treating apparatus 1 according to the modified embodiment includes check valves 81a and 81b in place of the switch valves 27a and 27b of Embodiment 1. Components identical to those of Embodiment 1 are shown with the same signs, and will not particularly be described.

The check valve 81a is mounted on the piping 25a. The check valve 81a permits the treating liquid to flow from the buffer tank 13 to the vaporizing container 23a, and prohibits the treating liquid to flow from the vaporizing container 23a to the buffer tank 13. Similarly, the check valve 81b is mounted on the piping 25b. The check valve 81b permits the treating liquid to flow from the buffer tank 13 to the vaporizing container 23b, and prohibits the treating liquid to flow from the vaporizing container 23b to the buffer tank 13.

The check valves 81a and 81b, for example, have valving elements operable to prevent reverse flow of the treating liquid due to the back pressure of the treating liquid (e.g. the treating liquid Sa in the vaporizing container 23a). When the pressure of the treating liquid Sa in the vaporizing container 23a is higher than the pressure of the treating liquid Ss in the buffer tank 13, the check valve 81a closes the flow path of the treating liquid between the buffer tank 13 and vaporizing container 23a. Similarly, when the pressure of the treating liquid Sb in the vaporizing container 23b is higher than the pressure of the treating liquid Ss in the buffer tank 13, the check valve 81b closes the flow path of the treating liquid between the buffer tank 13 and vaporizing container 23b. The controller 45 does not control the operation of the check valves 81a and 81b.

The check valves 81a and 81b are examples of the first treating liquid valve and the second treating liquid valve in this invention.

When the treating unit 5a uses the treating gas, the controller 45 closes the switch valve 33a and opens the switch valves 39a and 43a. When the switch valve 33a is closed and the switch valves 39a is opened, the internal pressure of the vaporizing container 23a becomes higher than the internal pressure of the buffer tank 13, and the pressure of the treating liquid Sa in the vaporizing container 23a becomes higher than the pressure of the treating liquid Ss in the buffer tank 13. The check valve 81a closes the flow path of the treating liquid between the buffer tank 13 and vaporizing container 23a. Consequently, the vaporizing container 23a is separated from the buffer tank 13 and vaporizing container 23b. The vaporizing container 23a can therefore vaporize the treating liquid Sa without being influenced by the buffer tank 13 and vaporizing container 23b. This can conveniently inhibit variations in the concentration of the treating gas in the vaporizing container 23a.

On the other hand, when the treating unit 5a does not use the treating gas, the controller 45 opens the switch valve 33a and closes the switch valves 39a and 43a. When the switch valve 33a is opened, the internal pressure of the vaporizing container 23a becomes substantially equal to the internal pressure of the buffer tank 13. The check valve 81a permits the treating liquid to flow from the buffer tank 13 to the vaporizing container 23a.

Similarly, when the treating unit 5b uses the treating gas, the controller 45 closes the switch valve 33b and opens the switch valves 39b and 43b. Consequently, the pressure of the treating liquid Sb in the vaporizing container 23b becomes higher than the pressure of the treating liquid Ss in the buffer tank 13, and the check valve 81b closes the flow path of the treating liquid between the buffer tank 13 and vaporizing container 23b. This can conveniently inhibit variations in the concentration of the treating gas in the vaporizing container 23b.

On the other hand, when the treating unit 5b does not use the treating gas, the controller 45 opens the switch valve 33b and closes the switch valves 39b and 43b. When the switch valve 33b is opened, the internal pressure of the vaporizing container 23b becomes substantially equal to the internal pressure of the buffer tank 13, and the check valve 81b permits the treating liquid to flow from the buffer tank 13 to the vaporizing container 23b.

Thus, the modified embodiment can also conveniently inhibit variations in the concentration of the treating gas. Since the controller 45 does not need to control the check valves 81a and 81b, the processing in the controller 45 can be simplified.

(2) In each foregoing embodiment, the treating liquid vaporizing apparatus 3 includes two vaporizing containers 23. This invention is not limited to such embodiments. For example, the treating liquid vaporizing apparatus 3 may include three or more vaporizing containers 23. In this case, the arrangement of vaporizing containers 23 can be changed as appropriate.

Figure 11:
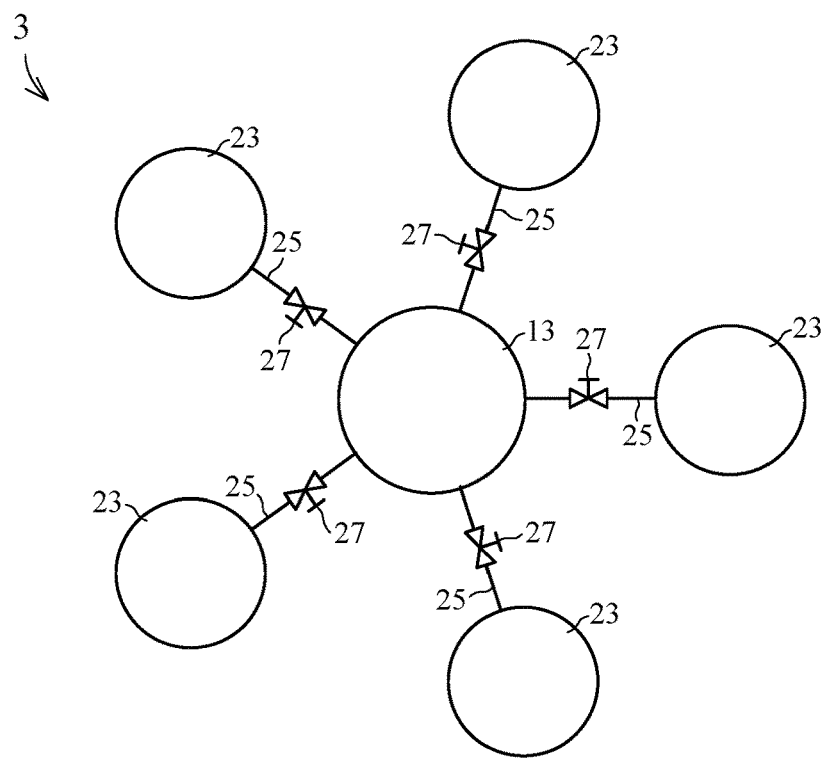
FIG. 11 is a plan view of a buffer tank and vaporizing containers according to another modified embodiment.

Reference is made to FIG. 11. FIG. 11 is a plan view of a buffer tank 13 and vaporizing containers 23. Components identical to those of Embodiment 1 are shown with the same signs, and will not particularly be described.

As shown, the treating liquid vaporizing apparatus 3 according to this modified embodiment includes five vaporizing containers 23, for example. The vaporizing containers 23 are arranged around the buffer tank 13.

The liquid vaporizing apparatus 3 according to the modified embodiment includes five lengths of piping 25 and five switch valves 27. Each piping 25 connects the buffer tank 13 and one of the vaporizing containers 23. Consequently, the five vaporizing containers 23 are connected to the buffer tank 13 in parallel with one another. The switch valves 27 are each mounted on one piping 25.

Each vaporizing container 23 is connected to communicate with one treating unit 5 (not shown). The treating gas produced in each vaporizing container 23 is sent to only one treating unit 5.

One vaporizing container 23 is an example of the first vaporizing container in this invention, and another vaporizing container 23 is an example of the second vaporizing container in this invention. One piping 25 is an example of the first supply pipe in this invention, and another piping 25 is an example of the second supply pipe in this invention. One switch valve 27 is an example of the first treating liquid valve in this invention, and another switch valve 27 is an example of the second treating liquid valve in this invention.

Figure 12:
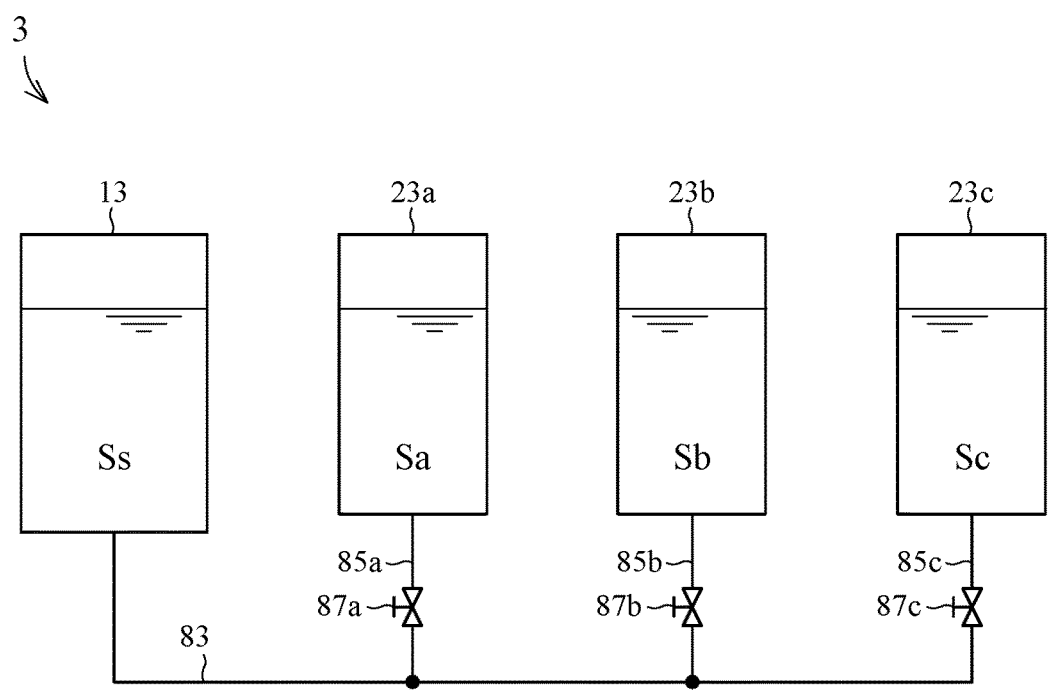
FIG. 12 is a front view of a buffer tank and vaporizing containers according to a further modified embodiment.

Reference is made to FIG. 12. FIG. 12 is a front view of a buffer tank 13 and vaporizing containers 23. Components identical to those of Embodiment 1 are shown with the same signs, and will not particularly be described.

As shown, a treating liquid vaporizing apparatus 3 according to this modified embodiment includes three vaporizing containers 23*a*, 23*b* and 23*c*, for example. In FIG. 12, signs "Sa", "Sb" and "Sc" are affixed to the treating liquids stored in the vaporizing containers 23*a*, 23*b* and 23*c*, respectively. Each vaporizing container 23 is disposed to one side of the buffer tank 13. The buffer tank 13 and vaporizing containers 23 may be arranged in a row in plan view (not shown).

The treating liquid vaporizing apparatus 3 according to the modified embodiment includes a common pipe 83 and branch pipes 85*a*, 85*b* and 85*c*. The common pipe 83 is connected to be in communication with the buffer tank 13. One end of each of the branch pipes 85*a*, 85*b* and 85*c* is connected to the common pipe 83. The other end of the branch pipe 85*a* is connected to the bottom of the vaporizing container 23*a*. The other end of the branch pipe 85*b* is connected to the bottom of the vaporizing container 23*b*. The other end of the branch pipe 85*c* is connected to the bottom of the vaporizing container 23*c*. Consequently, the vaporizing containers 23*a*, 23*b* and 23*c* are connected to the buffer tank 13 in parallel with one another.

The treating liquid vaporizing apparatus 3 according to the modified embodiment includes three switch valves 87*a*, 87*b* and 87*c*. The switch valve 87*a* is mounted on the branch pipe 85*a*. The switch valve 87*b* is mounted on the branch pipe 85*b*. The switch valve 87*c* is mounted on the branch pipe 85*c*.

Each of the vaporizing containers 23*a*, 23*b* and 23*c* is connected to one treating unit 5 (not shown). The treating gas produced in each of the vaporizing containers 23*a*, 23*b* and 23*c* is sent only to one treating unit 5.

One of the vaporizing containers 23*a*, 23*b* and 23*c* is an example of the first vaporizing container in this invention, and another of the vaporizing containers 23*a*, 23*b* and 23*c* is an example of the second vaporizing container in this invention. One of the branch pipes 85*a*, 85*b* and 85*c* is an example of the first supply pipe in this invention, and another of the branch pipes 85*a*, 85*b* and 85*c* is an example of the second supply pipe in this invention. One of the switch valves 87*a*, 87*b* and 87*c* is an example of the first treating liquid valve in this invention, and another of the switch valves 87*a*, 87*b* and 87*c* is an example of the second treating liquid valve in this invention.

(3) In foregoing Embodiment 1, the buffer tank 13 and vaporizing container 23*a* are arranged in exactly the same height position. This invention is not limited to this. For example, the vaporizing container 23*a* may be disposed in approximately the same height position as the buffer tank 13. Specifically, the vaporizing container 23*a* may be arranged to have the upper end thereof higher than the high level HL, and the lower end lower than the low level LL. In this case, the upper end of the buffer tank 13 may be higher or lower than the upper end of the vaporizing container 23*a*. The lower end of the buffer tank 13 may be higher or lower than the lower end of vaporizing container 23*a*. With such modified embodiment, the vaporizing container 23*a* can be conveniently provided laterally of the buffer tank 13.

Similarly, in Embodiment 1, the buffer tank 13 and vaporizing container 23*b* are arranged in the same height position, but this is not limitative. For example, the vaporizing container 23*b* may be disposed in approximately the same height position as the buffer tank 13.

A similar change may also be made to the arrangement of the buffer tank 13 and vaporizing container 23*a* and the arrangement of the buffer tank 13 and vaporizing container 23*b* described in Embodiments 2 and 3.

(4) In foregoing Embodiment 2, the vaporizing container 23*a* is disposed in a position higher than the buffer tank 13. This invention is not limited to this. For example, the vaporizing container 23*a* may be disposed laterally of the buffer tank 13. Similarly, in Embodiment 2, the vaporizing container 23*b* is disposed in a position higher than the buffer tank 13. The invention is not limited to this. For example, the vaporizing container 23*b* may be disposed laterally of the buffer tank 13. With this modified embodiment also, the treating liquid can be conveniently supplied to the vaporizing containers 23*a* and 23*b*.

(5) In each foregoing embodiment, the vaporizing container 23*a* and vaporizing container 23*b* are arranged in the same height position. This invention is not limited to this. The vaporizing container 23*a* and vaporizing container 23*b* may be arranged in different height positions.

(6) Each foregoing embodiment has not been described with regard to the arrangement of the treating units 5*a* and 5*b*. The treating units 5*a* and 5*b* can be installed in arbitrary positions. For example, the treating units 5*a* and 5*b* may be arranged in an up-down direction, one over the other. For example, the treating units 5*a* and 5*b* may be arranged horizontally in a row. For example, the treating unit 5*a* may be disposed in the same height position as the vaporizing container 23*a*, or may be disposed in a different height position to the vaporizing container 23*a*. For example, the treating unit 5*b* may be disposed in the same height position as the vaporizing container 23*b*, or may be disposed in a different height position to the vaporizing container 23*b*.

(7) Each foregoing embodiment has indicated HMDS as an example of treating liquid. This invention is not limited to this. For example, the treating liquid may be a silylation agent such as N-trimethyl silyldimethylamine (TMSDMA) or N-trimethyl silyldiethylamine (TMSDEA). For example, the treating liquid may be a solvent.

(8) Each foregoing embodiment has indicated hydrophobizing treatment as an example of treatment given by the treating units 5. This invention is not limited to this. For example, the treating units 5 may perform treatment which supplies a treating gas to wafers W after resist film formation. For example, the treating units 5 may perform treatment which supplies a treating gas to wafers W before exposure, after exposure, before development or after development. For example, the treating units 5 may perform treatment which supplies a treating gas to wafers W with DSA film formed thereon. Here, DSA film is formed on wafers W by coating the wafers W with a self-assembly material used in DSA (Directed Self Assembly) technique. In treating the wafers W after DSA film formation, it is preferable that the treating gas includes a solvent. Preferably, the solvent is at least one or more of toluene, heptane, acetone, propylene glycol monomethyl ether acetate, propylene glycol monomethyl ether, cyclohexanone, carbon bisulfide, and tetrahydrofuran, for example.

(9) In foregoing Embodiments 2 and 3, the flow path of the inert gas between the gas supply source 35 and vaporizing container 23a is opened and closed by the flow regulating valve 57a. This invention is not limited to this. For example, the flow regulating valve 57a may be changed to a switch valve. With this modified embodiment also, the flow path of the inert gas between the gas supply source 35 and vaporizing container 23a can be opened and closed conveniently. Similarly, the flow regulating valve 57b may be changed to a switch valve. With this modified embodiment also, the flow path of the inert gas between the gas supply source 35 and vaporizing container 23b can be opened and closed conveniently.

(10) In foregoing Embodiment 3, the flow path of the inert gas for attenuating the treating gas outputted from the vaporizing container 23a is opened and closed by the flow regulating valve 73a. This invention is not limited to this. For example, the flow regulating valve 73a may be changed to a switch valve. With this modified embodiment also, the flow path of the inert gas for attenuating the treating gas outputted from the vaporizing container 23a can be opened and closed conveniently. Similarly, the flow regulating valve 73b may be changed to a switch valve. With this modified embodiment also, the flow path of the inert gas for attenuating the treating gas outputted from the vaporizing container 23b can be opened and closed conveniently.

(11) In foregoing embodiment 3, the liquid detecting sensor 65 detects whether or not liquid is present in the drain pan 63. This invention is not limited to this. For example, the liquid detecting sensor 65 may detect whether or not the liquid is flowing through the drain pipe 61. This modified embodiment can also detect conveniently whether or not the treating liquid is overflowing the buffer tank 13.

(12) In each foregoing embodiment, the treating liquid vaporizing apparatus 3 includes the treating liquid supply source 11. This invention is not limited to this. That is, the treating liquid vaporizing apparatus 3 does not need to include the treating liquid supply source 11. For example, the buffer tank 13 may be connected for communication with a treating liquid supply source provided outside the treating liquid vaporizing apparatus 3, with the treating liquid supplied from the external treating liquid supply source to the buffer tank 13.

(13) In each foregoing embodiment, the treating liquid vaporizing apparatus 3 includes the gas supply source 35. This invention is not limited to this. That is, the treating liquid vaporizing apparatus 3 does not need to include the gas supply source 35. For example, the vaporizing containers 23a and 23b may be connected for communication with a gas supply source provided outside the treating liquid vaporizing apparatus 3, with the inert gas supplied from the external gas supply source to the vaporizing containers 23a and 23b.

(14) The substrate treating apparatus 1 in each foregoing embodiment may include a construction for supplying an inert gas to the treating units 5a and 5b. One of the treating gas and the inert gas may be selectively supplied to the treating unit 5a. Similarly, one of the treating gas and the inert gas may be selectively supplied to the treating unit 5b. For example, after supplying the treating gas to the treating unit 5a, the inert gas may be supplied to the treating unit 5a. With this arrangement, the atmosphere in the treating unit 5a can be replaced with the inert gas. Similarly, after supplying the treating gas to the treating unit 5b, the inert gas may be supplied to the treating unit 5b. With this arrangement, the atmosphere in the treating unit 5b can be replaced with the inert gas.

(15) Each of the foregoing embodiments and each of the modified embodiments described in paragraphs (1) to (14) above may be further varied as appropriate by replacing or combining their constructions with the constructions of the other modified embodiments.

This invention may be embodied in other specific forms without departing from the spirit or essential attributes thereof and, accordingly, reference should be made to the appended claims, rather than to the foregoing specification, as indicating the scope of the invention.

What is claimed is:

1. A treating liquid vaporizing apparatus comprising:
   a tank for storing a treating liquid;
   a first vaporizing container connected to the tank for vaporizing the treating liquid;
   a second vaporizing container connected to the tank in parallel with the first vaporizing container for vaporizing the treating liquid;
   a first treating liquid valve for opening and closing a flow path of the treating liquid between the tank and the first vaporizing container; and
   a second treating liquid valve for opening and closing a flow path of the treating liquid between the tank and the second vaporizing container, wherein
   the tank has an interior thereof opened to an exterior of the tank;
   the treating liquid vaporizing apparatus comprising:
      a first vent valve for opening and closing an interior of the first vaporizing container to an exterior of the first vaporizing container; and
      a second vent valve for opening and closing an interior of the second vaporizing container to an exterior of the second vaporizing container.

2. The treating liquid vaporizing apparatus according to claim 1, wherein:
   a treating gas produced in the first vaporizing container is sent only to a first treating unit; and
   a treating gas produced in the second vaporizing container is sent only to a second treating unit.

3. The treating liquid vaporizing apparatus according to claim 1, wherein the first vaporizing container and the second vaporizing container are arranged laterally of the tank, respectively.

4. The treating liquid vaporizing apparatus according to claim 1, wherein:
   when the first treating liquid valve and the first vent valve are opened, the treating liquid naturally moves between the tank and the first vaporizing container, thereby equalizing a liquid level of the treating liquid in the tank and a liquid level of the treating liquid in the first vaporizing container; and when the second treating liquid valve and the second vent valve are opened, the treating liquid naturally moves between the tank and the second vaporizing container, thereby equalizing a liquid level of the treating liquid in the tank and a liquid level of the treating liquid in the second vaporizing container.

5. The treating liquid vaporizing apparatus according to claim 1, wherein;
the first vent valve opens when the first treating liquid valve is open; and
the second vent valve opens when the second treating liquid valve is open.

6. The treating liquid vaporizing apparatus according to claim 1, comprising a pressure regulator for regulating pressure inside the tank.

7. The treating liquid vaporizing apparatus according to claim 6, wherein:
the first vaporizing container is disposed in a position higher than the tank; and
the second vaporizing container is disposed in a position higher than the tank.

8. The treating liquid vaporizing apparatus according to claim 6, wherein:
when the first treating liquid valve is open and the pressure regulator regulates the pressure inside the tank, the treating liquid is forcibly moved between the tank and the first vaporizing container; and
when the second treating liquid valve is open and the pressure regulator regulates the pressure inside the tank, the treating liquid is forcibly moved between the tank and the second vaporizing container.

9. The treating liquid vaporizing apparatus according to claim 1, wherein the tank has an upper end thereof lower than both an upper end of the first vaporizing container and an upper end of the second vaporizing container.

10. The treating liquid vaporizing apparatus according to claim 1, comprising:
a first inert gas valve for opening and closing a flow path of an inert gas sent to the first vaporizing container; and
a second inert gas valve for opening and closing a flow path of the inert gas sent to the second vaporizing container.

11. The treating liquid vaporizing apparatus according to claim 10, wherein:
when the first treating liquid valve is open, the first inert gas valve is closed; and
when the second treating liquid valve is open, the second inert gas valve is closed.

12. The treating liquid vaporizing apparatus according to claim 1, comprising:
a first treating gas valve for opening and closing a flow path of a treating gas outputted from the first vaporizing container; and
a second treating gas valve for opening and closing a flow path of a treating gas outputted from the second vaporizing container.

13. The treating liquid vaporizing apparatus according to claim 12, wherein:

when the first treating liquid valve is open, the first treating gas valve is closed; and
when the second treating liquid valve is open, the second treating gas valve is closed.

14. The treating liquid vaporizing apparatus according to claim 1, comprising a tank treating liquid valve for opening and closing a flow path of the treating liquid supplied from a treating liquid supply source to the tank.

15. The treating liquid vaporizing apparatus according to claim 14, comprising a liquid level detecting sensor for detecting a liquid level of the treating liquid in the tank;
wherein the tank treating liquid valve is opened and closed based on detection results of the liquid level detecting sensor.

16. The treating liquid vaporizing apparatus according to claim 1, comprising an overflow sensor for detecting whether the treating liquid is overflowing an upper end of the tank;
wherein the first treating liquid valve and the second treating liquid valve are closed when it is determined based on detection results of the overflow sensor that the treating liquid is overflowing the tank.

17. The treating liquid vaporizing apparatus according to claim 1, comprising:
a first attenuation valve for opening and closing a flow path of an inert gas for attenuating a treating gas outputted from the first vaporizing container; and
a second attenuation valve for opening and closing a flow path of the inert gas for attenuating a treating gas outputted from the second vaporizing container.

18. The treating liquid vaporizing apparatus according to claim 1, wherein the first vaporizing container and the second vaporizing container are arranged in the same height position.

19. A treating liquid vaporizing apparatus comprising:
a tank for storing a treating liquid;
a first vaporizing container connected to the tank for vaporizing the treating liquid;
a second vaporizing container connected to the tank in parallel with the first vaporizing container for vaporizing the treating liquid;
a first treating liquid valve for opening and closing a flow path of the treating liquid between the tank and the first vaporizing container;
a second treating liquid valve for opening and closing a flow path of the treating liquid between the tank and the second vaporizing container; wherein
a treating gas produced in the first vaporizing container is sent only to a first treating unit; and
a treating gas produced in the second vaporizing container is sent only to a second treating unit;
the treating liquid vaporizing apparatus further comprising:
a first vent valve for opening and closing an interior of the first vaporizing container to an exterior of the first vaporizing container; and
a second vent valve for opening and closing an interior of the second vaporizing container to an exterior of the second vaporizing container.

* * * * *